US012784862B2

(12) United States Patent
Kim et al.

(10) Patent No.: US 12,784,862 B2
(45) Date of Patent: Nov. 3, 2026

(54) MEMORY DEVICE INCLUDING REFERENCE RESISTANCE

(71) Applicant: Samsung Electronics Co., Ltd., Suwon-si (KR)

(72) Inventors: Daeshik Kim, Suwon-si (KR); Suho Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 18/790,500

(22) Filed: Jul. 31, 2024

(65) Prior Publication Data

US 2025/0226049 A1 Jul. 10, 2025

(30) Foreign Application Priority Data

Jan. 9, 2024 (KR) ........................ 10-2024-0003609

(51) Int. Cl.
*G11C 29/50* (2006.01)
*G11C 11/16* (2006.01)

(52) U.S. Cl.
CPC .... *G11C 29/50004* (2013.01); *G11C 11/1673* (2013.01); *G11C 11/1675* (2013.01); *G11C 2029/5004* (2013.01)

(58) Field of Classification Search
CPC ........................ G11C 11/1673; G11C 11/1675
See application file for complete search history.

(56) References Cited

U.S. PATENT DOCUMENTS

| | | | |
|---|---|---|---|
| 6,385,082 | B1 | 5/2002 | Abraham et al. |
| 6,538,919 | B1 | 3/2003 | Abraham et al. |
| 6,980,470 | B2 | 12/2005 | Ohmori |
| 6,990,015 | B2 | 1/2006 | Honda et al. |
| 6,995,346 | B2 | 2/2006 | Johanneson et al. |
| 6,999,339 | B2 | 2/2006 | Tuttle et al. |
| 7,113,422 | B2 | 9/2006 | Theel |
| 7,126,844 | B2 | 10/2006 | Theel |
| 7,929,334 | B2 | 4/2011 | Rao et al. |
| 8,072,815 | B2 | 12/2011 | Tran et al. |
| 8,102,701 | B2 | 1/2012 | Prejbeanu et al. |
| 8,217,684 | B2 | 7/2012 | Yuh et al. |

(Continued)

FOREIGN PATENT DOCUMENTS

| | | | |
|---|---|---|---|
| CN | 102142442 | A | 8/2011 |
| CN | 103035836 | A | 4/2013 |

(Continued)

*Primary Examiner* — Amir Zarabian
*Assistant Examiner* — Anthony Thinh Tang
(74) *Attorney, Agent, or Firm* — Fish & Richardson P.C.

(57) ABSTRACT

A memory device includes a memory cell array including a plurality of memory cells and divided into a first region and a second region, a sensing circuit configured to determine data stored in memory cells of the first region based on a reference resistance, and a mismatch correction circuit configured to shift a value of the reference resistance depending on a temperature and correct the shifted value of the reference resistance based on at least one of a value of a magnetic tunnel junction (MTJ) resistance of the memory cell array and a leakage current of the memory cell array. The second region is configured to store a value of the reference resistance for distinguishing a parallel state and an anti-parallel state of a memory cell where the data is stored.

8 Claims, 26 Drawing Sheets

(56) References Cited

U.S. PATENT DOCUMENTS

| | | | |
|---|---|---|---|
| 8,329,319 B2 | 12/2012 | Shi et al. | |
| 8,339,843 B2 | 12/2012 | Katti | |
| 8,743,597 B2 | 6/2014 | Prejbeanu et al. | |
| 9,093,155 B2 | 7/2015 | Sakurai | |
| 9,165,626 B2 | 10/2015 | Prejbeanu et al. | |
| 9,666,246 B2 | 5/2017 | Yang | |
| 9,839,127 B2 | 12/2017 | Kwon et al. | |
| 10,037,791 B2 | 7/2018 | Sanasi | |
| 10,079,058 B1 | 9/2018 | Eleftheriou et al. | |
| 10,230,044 B2 | 3/2019 | Zhu et al. | |
| 10,360,976 B2 | 7/2019 | Katayama | |
| 10,522,747 B2 | 12/2019 | Zhu et al. | |
| 10,672,977 B2 | 6/2020 | Guo | |
| 10,675,106 B2 | 6/2020 | Tsuboi et al. | |
| 10,732,933 B2 | 8/2020 | Choi | |
| 11,137,785 B2 | 10/2021 | Chang et al. | |
| 11,335,390 B1 | 5/2022 | Tiruvuru et al. | |
| 11,538,512 B2 | 12/2022 | Katayama | |
| 11,563,170 B2 | 1/2023 | Zhu et al. | |
| 11,651,807 B2 | 5/2023 | Alam et al. | |
| 11,798,621 B2 | 10/2023 | Kim | |
| 2005/0195627 A1 | 9/2005 | Hutchens et al. | |
| 2017/0263299 A1 | 9/2017 | Takizawa | |
| 2021/0365060 A1 | 11/2021 | Chang et al. | |
| 2021/0383844 A1* | 12/2021 | Antonyan | G11C 11/1673 |
| 2022/0076742 A1 | 3/2022 | Kim | |
| 2022/0084591 A1 | 3/2022 | Kim | |
| 2022/0328085 A1* | 10/2022 | Kim | G11C 11/1677 |
| 2023/0058423 A1 | 2/2023 | Chevallier et al. | |

FOREIGN PATENT DOCUMENTS

| | | |
|---|---|---|
| CN | 103165171 A | 6/2013 |
| CN | 105428522 A | 3/2016 |
| CN | 105514261 A | 4/2016 |
| CN | 105865216 A | 8/2016 |
| CN | 106068175 A | 11/2016 |
| CN | 108183645 A | 6/2018 |
| CN | 109932273 A | 6/2019 |
| CN | 110858496 A | 3/2020 |
| CN | 111406248 A | 7/2020 |
| CN | 113890590 A | 1/2022 |
| CN | 114242135 A | 3/2022 |
| EP | 1 429 542 A1 | 6/2004 |
| EP | 2 232 495 B1 | 1/2013 |
| EP | 2 575 136 B1 | 12/2014 |
| EP | 2 605 246 B1 | 2/2015 |
| JP | 2013-080920 A | 5/2013 |
| RU | 2 599 939 C2 | 10/2016 |
| TW | 201322513 A1 | 6/2013 |
| WO | 2005/050712 A2 | 6/2005 |
| WO | 2007/046769 A1 | 4/2007 |
| WO | 2009/074411 A1 | 6/2009 |
| WO | 2012/050604 A1 | 4/2012 |
| WO | 2019/216994 A1 | 11/2019 |
| WO | 2023/027903 A1 | 3/2023 |

* cited by examiner

| Rref | Read/Write Voltage (Current) |
|---|---|
| 0000 | 1111 |
| 0001 | 1110 |
| 0010 | 1101 |
| ⋮ | ⋮ |
| 1001 | 0110 |
| ⋮ | ⋮ |
| 1111 | 0000 |

Optimal Read/Write Voltage (Current)

MEMORY DEVICE INCLUDING REFERENCE RESISTANCE

CROSS-REFERENCE TO RELATED APPLICATIONS

This application claims priority under 35 U.S.C. § 119 to Korean Patent Application No. 10-2024-0003609 filed on Jan. 9, 2024, in the Korean Intellectual Property Office, the disclosures of which are incorporated by reference herein in their entireties.

BACKGROUND

Various example embodiments described herein relate to a semiconductor device, and more particularly, relate to a device and/or a method for determining a good or optimal reference resistance value of a memory device including a magnetic tunnel junction element.

Nowadays, various types of electronic devices are being used. As a high-speed and/or low-power electronic device is required or desirable, the electronic device may require or desire a memory device satisfying the following: high reliability, high speed, and/or low power consumption. To meet or at least partially satisfy these, a magnetic memory element has been suggested as a memory element of the memory device. Because the magnetic memory element operates at high speed and provides a nonvolatile characteristic, the magnetic memory element is on the spotlight as a next-generation semiconductor memory element.

In general, the magnetic memory element may include a magnetic tunnel junction (MTJ) element. The MTJ element may include two magnetic materials and an insulating layer interposed therebetween. A resistance value of the MTJ element may vary depending on magnetization directions of two magnetic materials. For example, the MTJ element may have a great resistance value when the magnetization directions of two magnetic materials are anti-parallel to each other and may have a small resistance value when the magnetization directions of two magnetic materials are parallel to each other. Data may be written or read by using a difference between the resistance values.

Meanwhile, in association with the reliability and endurance of the magnetic memory element, an issue such as read disturbance according to the spin torque of the magnetic memory element may occur when the read operation of the memory device is performed by using a voltage (or current) of an excessive magnitude, and an issue such as read fail may occur when the read operation of the memory device is performed by using a voltage (or current) of an insufficient magnitude. Alternatively or additionally, the endurance issue of the memory device may occur when the program operation of the memory device is performed by using a voltage (or current) of an excessive magnitude, and the reliability issue of the memory device may occur when the program operation of the memory device is performed by using a voltage (or current) of an insufficient magnitude. In this case, because a value of a read/write voltage (or current) is associated with a reference resistance used to distinguish the parallel state and the anti-parallel state, it is very important to determine an accurate value of the reference resistance.

SUMMARY

Various example embodiments may provide a device and/or a method for determining a good (or an optimal) reference resistance value through a reduced (or minimum) number of times and determining a good (or an optimal) reference resistance value in consideration of an ambient temperature and/or a physical characteristic of an MTJ element.

According to various example embodiments, a memory device includes a memory cell array including a plurality of memory cells divided into a first region and a second region, a sensing circuit configured to determine data stored in memory cells of the first region based on a reference resistance, and a mismatch correction circuit configured to shift a value of the reference resistance based on a temperature and to adjust the shifted value of the reference resistance based on at least one of a value of a magnetic tunnel junction (MTJ) resistance of the memory cell array and a leakage current of the memory cell array. The second region is configured to store a value of the reference resistance for distinguishing a parallel state and an anti-parallel state of a memory cell where the data are stored.

Alternatively or additionally according to various example embodiments, an operating method of a memory device which includes a plurality of memory cells includes programming at least one memory cell among the plurality of memory cells to a first state, counting fail bits of the at least one memory cell programmed to the first state by using a plurality of resistances having different values, for each of the plurality of resistance, programming the at least one memory cell to a second state, counting fail bits of the at least one memory cell programmed to the second state by using the plurality of resistances, for each of the plurality of resistances, selecting a value of a reference resistance among the plurality of resistances, based on the counting results associated with the first state and the counting results associated with the second state, shifting the value of the selected reference resistance based on a shifting option and an ambient temperature, and adjusting the shifted value of the reference resistance based on a magnetic tunnel junction (MTJ) resistance of the plurality of memory cells.

Alternatively or additionally according to various example embodiments, an operating method of a memory device which includes a plurality of memory cells includes programming at least one memory cell among the plurality of memory cells to a first state, counting fail bits of the at least one memory cell programmed to the first state by using a plurality of resistances having different values, for each of the plurality of resistances, programming the at least one memory cell to a second state, counting fail bits of the at least one memory cell programmed to the second state by using the plurality of resistances, for each of the plurality of resistances, selecting a value of a reference resistance among the plurality of resistances, based on the counting results associated with the first state and the counting results associated with the second state, shifting the value of the selected reference resistance based on a shifting option and an ambient temperature, and adjusting the shifted value of the selected reference resistance based on a leakage current flowing to a memory cell from among memory cells connected to one bit line, the memory cell not targeted for a read operation or a program operation.

BRIEF DESCRIPTION OF THE FIGURES

The above and other objects and/or features of inventive concepts will become apparent by describing in detail various example embodiments thereof with reference to the accompanying drawings.

DETAILED DESCRIPTION

Below, various example embodiments will be described in detail and clearly to such an extent that an ordinary one in the art easily carries out various inventive concepts.

In the detailed description, components described with reference to the terms “unit”, “module”, “block”, “~er or ~or”, etc. and function blocks illustrated in drawings will be implemented in the form of software, hardware, or a combination thereof. For example, the software may include a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
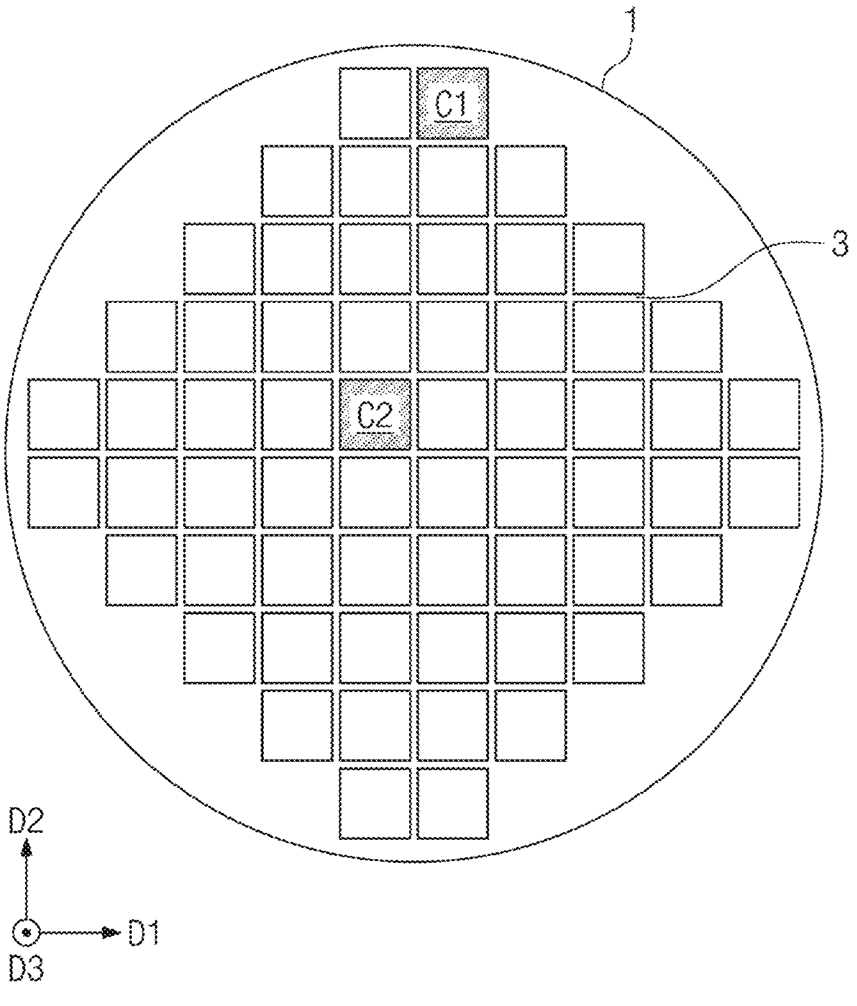
FIG. 1 is a diagram illustrating a substrate where memory chips according to various example embodiments are integrated.

FIG. 1 is a diagram illustrating a substrate 1 where memory devices according to various example embodiments are integrated. The substrate 1 may include a plurality of memory chips including a first memory chip C1 and a second memory chip C2, and a scribe line region 3 between the memory chips. The memory chips may be two-dimensionally arranged along a first direction D1 and a second direction D2. Each chip may be surrounded by the scribe line region 3. That is, the scribe line region 3 may be defined between memory chips adjacent in the first direction D1 and between memory chips adjacent in the second direction D2.

In some example embodiments, the substrate 1 may be or include (or be included in) a semiconductor substrate such as a semiconductor wafer. A diameter of the wafer may be 300 mm; however, example embodiments are not limited thereto, and a diameter of the wafer may be 200 mm or less, or 450 mm or more. The substrate 1 may be or include one or more of a bulk silicon substrate, a silicon on insulator (SOI) substrate, a germanium substrate, a germanium on insulator (GOI) substrate, a silicon-germanium substrate, or a substrate of an epitaxial thin film formed through selective epitaxial growth (SEG). For example, the substrate 1 may include at least one of silicon (Si), germanium (Ge), silicon germanium (SiGe), gallium arsenic (GaAs), indium gallium arsenide (InGaAs), aluminum gallium arsenide (AlGaAs), or a mixture thereof. The substrate 1 may have a single crystal structure. In some cases, the substrate 1 may be doped, e.g., may be lightly doped with impurities; example embodiments are not limited thereto. In some cases, the substrate may have a notch (not shown) at an edge thereof; example embodiments are not limited thereto.

One or more of a number of, a size of, and an arrangement of chips on the substrate 1 may be variously changed according to example embodiments. For example, each memory chip C1 and C2 may be rectangular, e.g., may be square; example embodiments are not limited thereto. There may be memory chips patterned towards the edge of the substrate 1; example embodiments are not limited thereto. The scribe region 3 may have the same, or different, widths depending on a direction; example embodiments are not limited thereto.

In some examples, the first memory chip C1 may relatively represent a memory chip formed at or near a periphery of (or an edge of) the substrate 1, and the second memory chip C2 may relatively represent a memory chip formed on or near the center of the substrate 1.

Meanwhile, a program characteristic and/or a reference resistance characteristic of memory cells constituting (or included in) a memory chip may vary, for example, depending on a location on the substrate 1, at which the memory chip is formed. For example, when the memory chips formed on the substrate 1 include MRAM cells, the size of the MRAM cell may vary depending on a location in the substrate 1, at which a memory device is located. For example, the size of the MRAM cell may vary based on one or more of a photolithographic effect or an etching effect.

For example, the size of the MRAM cell of the first memory chip C1 placed on an outer portion of the substrate 1 may be relatively small due to the manufacturing process. In contrast, the size of the MRAM cell of the second memory chip C2 placed on an inner portion of the substrate 1 may be relatively large due to the manufacturing process. In contrast, due to the manufacturing process, the size of the MRAM cell of the first memory chip C1 may be relatively large, and the size of the MRAM cell of the second memory chip C2 may be relatively small. According to various example embodiments, a good (or an optimal) reference resistance value for the read operation and/or the write operation of a relevant chip may be determined in consideration of a relative size of the MRAM cell.

Meanwhile, the reference resistance value may tend to change depending on a temperature of an ambient environment. According to some example embodiments, a good or an optimal reference resistance value at a room temperature and a good or an optimal reference resistance value at a cold temperature may be obtained by shifting a reference resistance value measured at a specific temperature (e.g., a hot temperature). In this case, one or more of the size of the MRAM cell, the magnitude of a leakage current, etc. may be considered in the process of determining a good or optimal reference resistance value at the room temperature or cold temperature through the shifting. Accordingly, a reference resistance value close to an actual optimal reference resistance value at the room temperature or cold temperature may be obtained. In some cases, because there is no need to test reference resistance values for respective temperature zones in the process of testing a memory chip, a test time may be shortened. This will be described in detail below.

Figure 2:
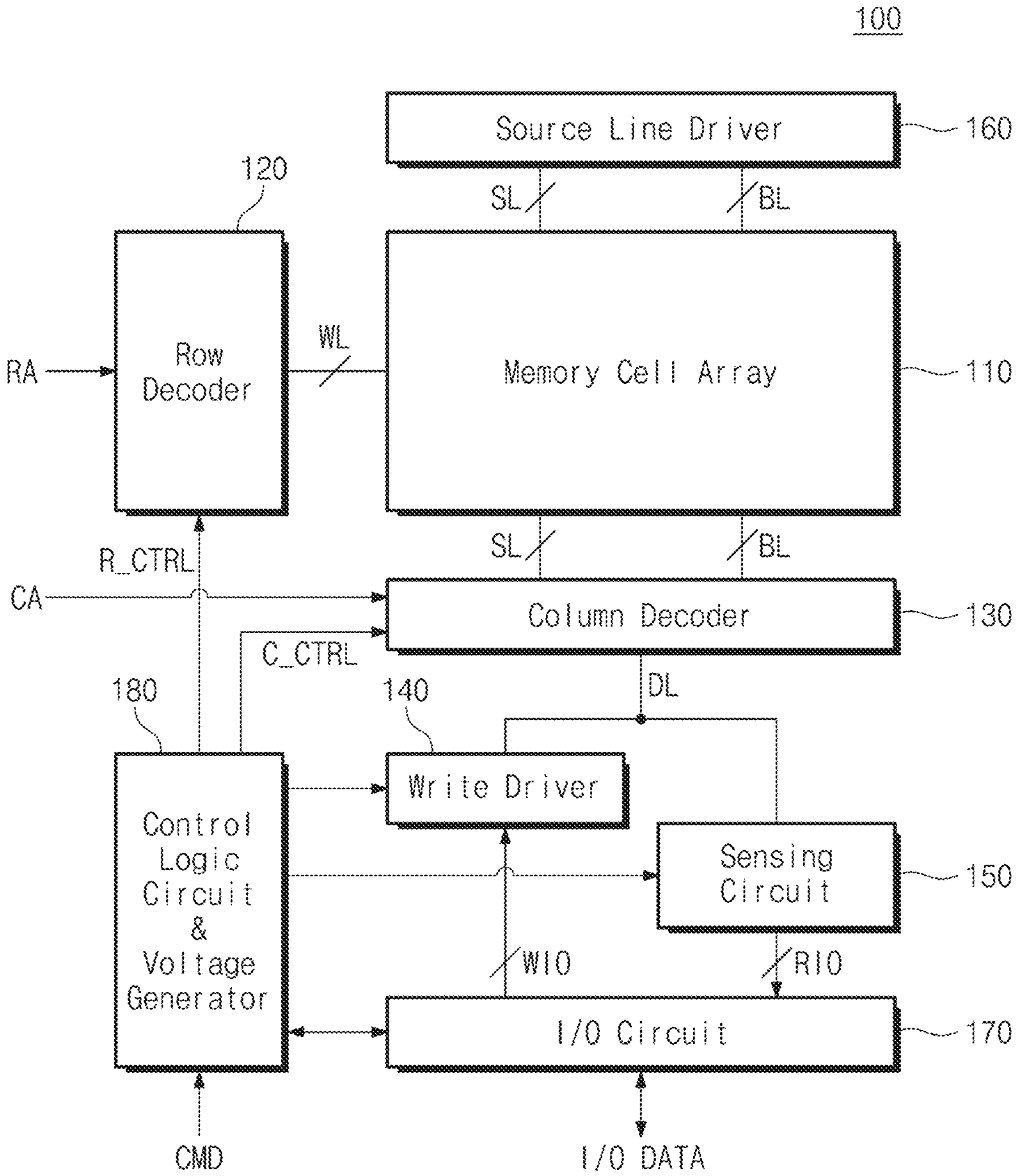
FIG. 2 is a diagram illustrating a configuration of a memory device including a memory chip of FIG. 1.

FIG. 2 is a diagram illustrating a configuration of the memory chips C1 and C2 of FIG. 1. A memory device 100 may include a memory cell array 110, a row decoder 120, a column decoder 130, a write driver 140, a sensing circuit 150, a source line driver 160, an input/output circuit 170, and a control logic circuit and voltage generator 180. In some example embodiments, there may be a redundancy checking circuit; example embodiments are not limited thereto. In some example embodiments, each of the memory chips C1 and C2 of FIG. 1 may include the memory cell array 110. However, example embodiments are not limited thereto. For example, each of the memory chips C1 and C2 may further include one or more of the remaining components of the memory device 100, in addition to the memory cell array 110.

The memory cell array 110 may include a plurality of memory cells each configured to store data. For example, each memory cell may include a variable resistance element, and a value of data stored therein may be determined based on a resistance value of the variable resistance element. In some cases, the memory cell array 110 may include the same or different modalities of memory cells. For example, each memory cell may include a magneto-resistive RAM (MRAM) cell, a spin transfer torque MRAM (STT-MRAM) cell, a spin-orbit torque MRAM (SOT-MRAM) cell, a phase-change RAM (PRAM) cell, a resistive RAM (ReRAM) cell, etc. As used herein, below, the description will be given under the assumption that each memory cell includes an STT-MRAM cell.

The memory cells constituting the memory cell array 110 may be connected to source lines SL, bit lines BL, and word lines WL. For example, memory cells arranged along a row may be connected in common to a word line corresponding to the row, and memory cells arranged along a column may be connected in common to a source line and a bit line corresponding to the column. In some cases, the memory cell array 110 may include a redundant array and/or a dummy array of memory cells that are electrically inactive.

The row decoder 120 may select (or drive) the word line WL connected to a memory cell targeted for the read operation or the program operation, based on a row address RA and a row control signal R_CTRL. The row decoder 120 may provide the selected word line with a driving voltage received from the control logic circuit and voltage generator 180.

The column decoder 130 may select the bit line BL and/or the source line SL connected to the memory cell targeted for the read operation or the write operation, based on a column address CA and a column control signal C_CTRL.

In a program operation, the write driver 140 may drive a program voltage (or a write current) for storing write data in a memory cell selected by the row decoder 120 and the column decoder 130. For example, in the program operation of the memory device 100, the write driver 140 may store the write data in the selected memory cell by controlling a voltage of a data line DL based on the write data provided from the input/output circuit 170 through a write input/output line WIO.

Meanwhile, the data line DL is illustrated for convenience of description and for brevity of drawing, but the data line DL may be understood as corresponding to the bit line BL and the source line SL selected by the column decoder 130.

In a read operation, the sensing circuit 150 may sense a signal output through the data line DL to determine a value of data stored in the selected memory cell. The sensing circuit 150 may be connected to the column decoder 130 through the data line DL and may be connected to the input/output circuit 170 through a read input/output line RIO. The sensing circuit 150 may output the sensed read data to the input/output circuit 170 through the read input/output line RIO.

The source line driver 160 may drive the source line SL with a voltage of a specific level under control of the control logic circuit and voltage generator 180. For example, the source line driver 160 may be provided with a voltage for driving the source line SL from the control logic circuit and voltage generator 180. For example, a value of a voltage applied from the source line driver 160 to the source line SL when the write operation is performed such that a memory cell has a great resistance value (e.g., an anti-parallel state) may be different from a value of a voltage applied from the source line driver 160 to the source line SL when the write operation is performed such that a memory cell has a small resistance value (e.g., a parallel state).

Meanwhile, although not illustrated in drawings, the memory device 100 may further include an anti-fuse array. The anti-fuse array includes anti-fuses arranged along rows and columns. For example, an anti-fuse which is a one-time programmable (OTP) memory may be nonvolatile. Information about the memory device 100 may be programmed in the anti-fuse array. For example, information about a fail address of the memory cell array 110, information about internal voltages (e.g., a program voltage and a read voltage) of the memory device 100, etc. may be written in the anti-fuse array. In particular, according to various example embodiments, information about a good or an optimal program voltage value determined in the process of testing a memory device may be programmed in the anti-fuse array.

Figure 3:
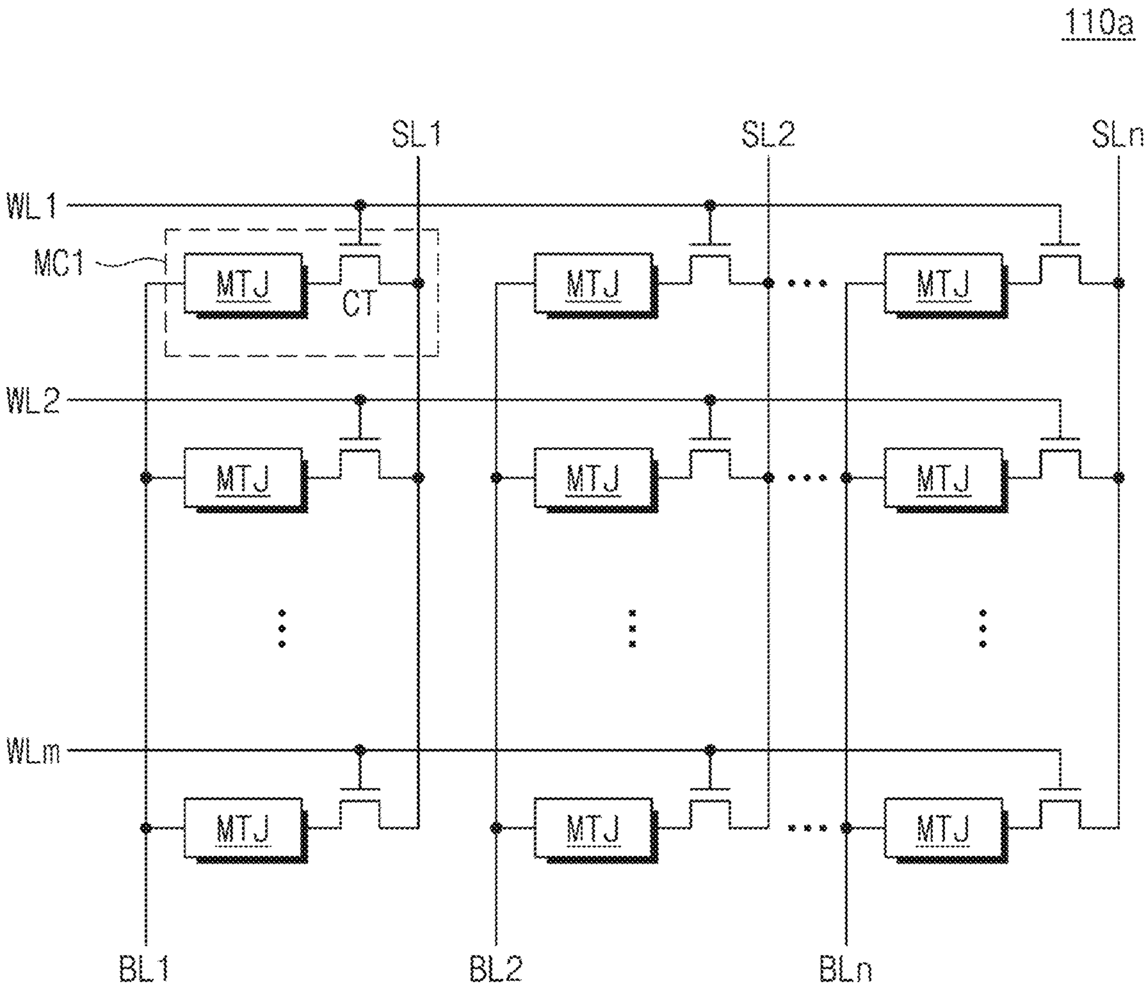
FIG. 3 is a circuit diagram illustrating a configuration of a memory cell array of FIG. 2.

FIG. 3 is a circuit diagram illustrating a configuration of the memory cell array 110 of FIG. 2. A memory cell array 110*a* may include a plurality of memory cells arranged along row and column directions. Each memory cell may include a magnetic tunnel junction (MTJ) element and a cell transistor CT. As the MTJ element of each memory cell is programmed to have a specific resistance value, data corresponding to the specific resistance value may be stored in each memory cell. In some example embodiments, a memory cell indicated by a dotted box from among the plurality of memory cells is marked by "MC1".

The plurality of memory cells may be connected to word lines WL1 to WLm, bit lines BL1 to BLn, and source lines SL1 to SLn. Here, m may be an integer greater than, equal to, or less than n. In the first memory cell MC1, a first end of the MTJ element may be connected to the first bit line BL1, and a second end of the MTJ element may be connected to a first end of the cell transistor CT. A second end of the cell transistor CT may be connected to the first source line SL1, and a gate electrode of the cell transistor CT may be connected to the first word line WL1.

Figure 4:
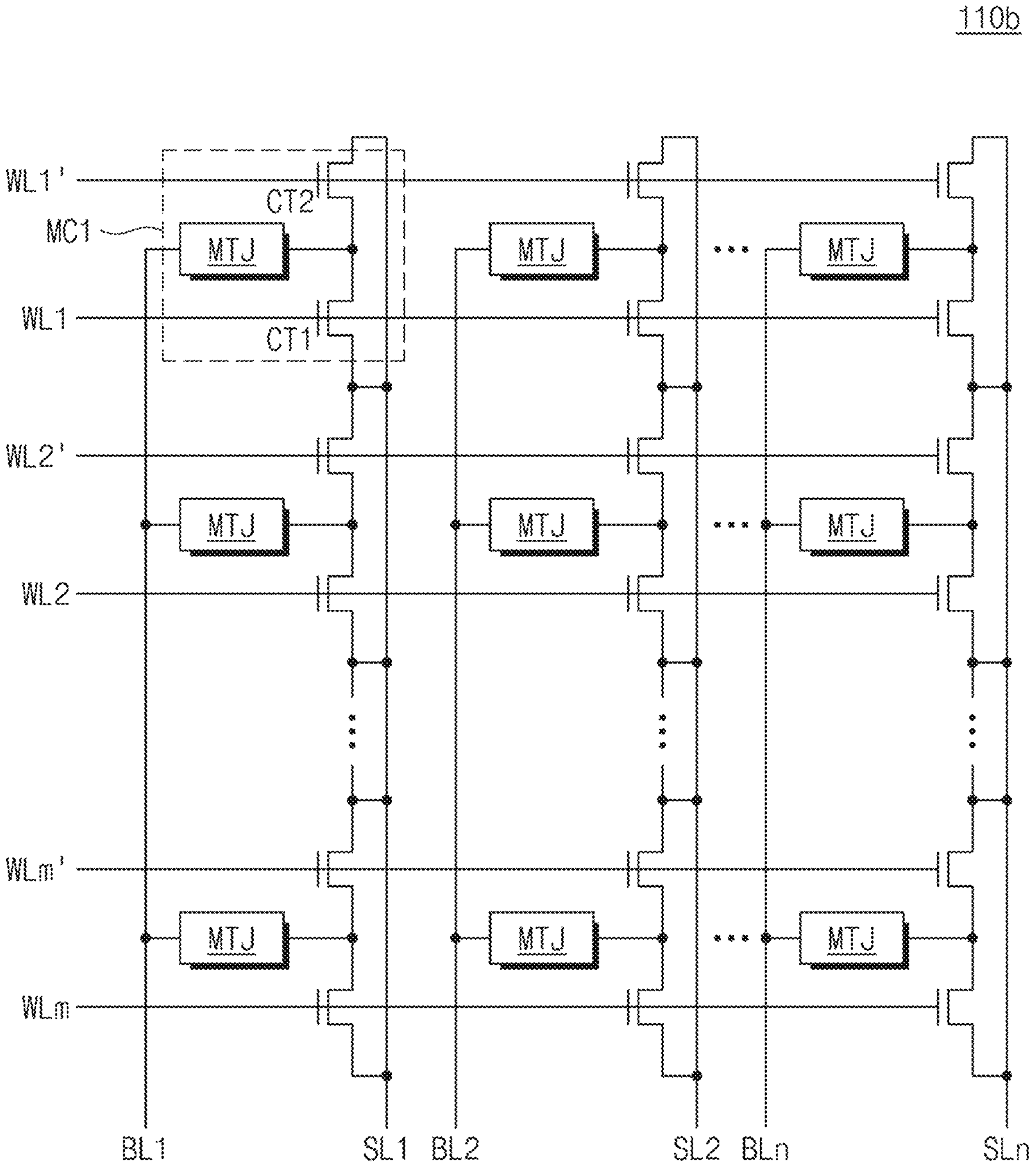
FIG. 4 is a circuit diagram illustrating a configuration of a memory cell array of FIG. 2.

FIG. 4 is a circuit diagram illustrating an exemplary configuration of the memory cell array 110 of FIG. 2. A memory cell array 110*b* may include a plurality of memory cells arranged along row and column directions. Each memory cell may include a magnetic tunnel junction (MTJ) element and two cell transistors. Some example embodiments where a first memory cell MC1 indicated by a dotted box from among the plurality of memory cells includes an MTJ element, a first cell transistor CT1, and a second cell transistor CT2 is illustrated in FIG. 4.

The first memory cell MC1 may have a structure in which the two cell transistors CT1 and CT2 share one MTJ element. In the first memory cell MC1, a first end of the MTJ element may be connected to the first bit line BL1, and a second end of the MTJ element may be connected to first ends of the first and second cell transistors CT1 and CT2. Second ends of the cell transistors CT1 and CT2 may be connected to the first source line SL1. A gate electrode of the first cell transistor CT1 may be connected to the first word line WL1, and a gate electrode of the second cell transistor CT2 may be connected to a first sub-word line WL1'. Each of the cell transistors CT1 and CT2 may be switched on or switched off by a signal (or a voltage) provided through a word line or a sub-word line.

Figure 5:
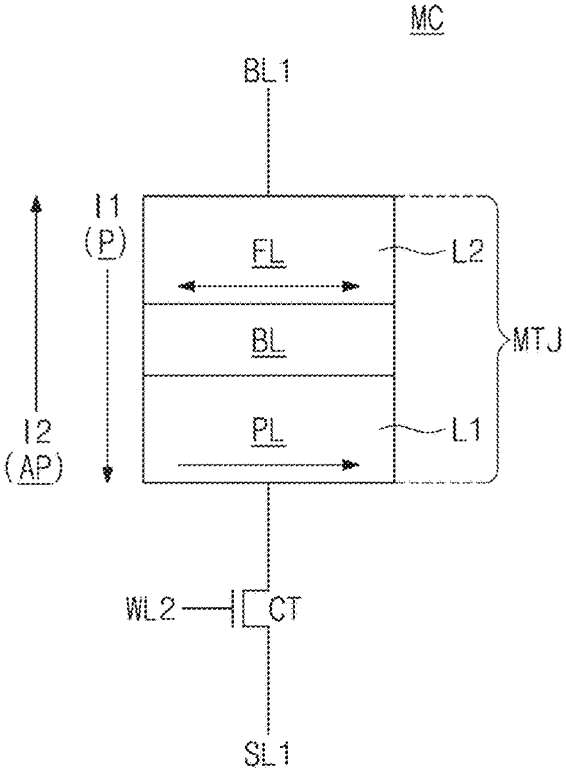
FIGS. 5 and 6 are diagrams illustrating a configuration of a memory cell of FIG. 3.
Figure 6:
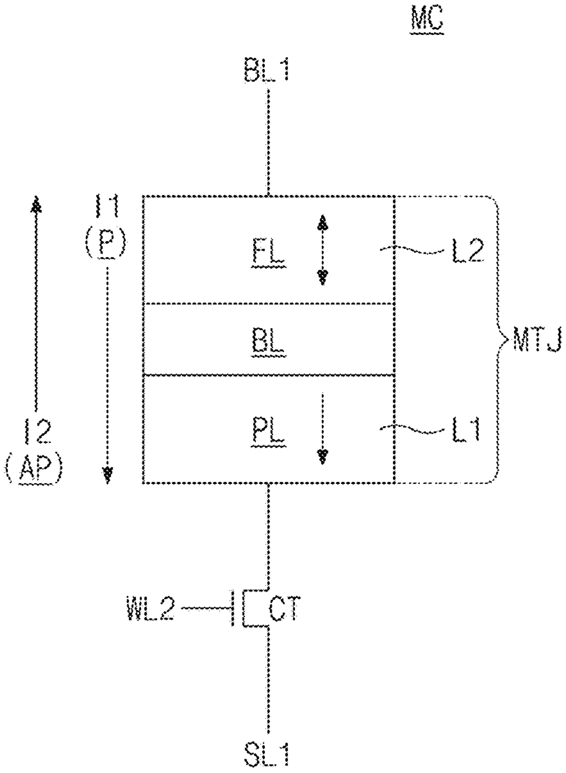

FIGS. 5 and 6 illustrate a configuration of a memory cell of FIG. 3.

Referring to FIGS. 5 and 6, an MTJ element may include a first magnetic layer L1, a second magnetic layer L2, and a barrier layer BL (or a tunneling layer) interposed therebetween. The barrier layer BL may include at least one of a magnesium (Mg) oxide layer, a titanium (terminal) oxide layer, an aluminum (Al) oxide layer, a magnesium-zinc (Mg—Zn) oxide layer, or a magnesium-boron (Mg—B) oxide layer, or a combination thereof. Each of the first magnetic layer L1 and the second magnetic layer L2 may include at least one magnetic layer.

In detail, the first magnetic layer L1 may include a reference layer PL (e.g., a pinned layer) having a magnetization direction fixed (or pinned) in a specific direction, and the second magnetic layer L2 may include a free layer FL having a magnetization direction which is changeable to be parallel or anti-parallel to the magnetization direction of the reference layer PL. However, FIGS. 5 and 6 show, for example, the case where the first magnetic layer L1 includes the reference layer PL and the second magnetic layer L2 includes the free layer FL, but example embodiments are not limited thereto. For example, unlike the example illustrated in FIGS. 5 and 6, the first magnetic layer L1 may include a free layer, and the second magnetic layer L2 may include a pinned layer.

In some example embodiments, as illustrated in FIG. 5, magnetization directions may be mostly parallel to an interface of the barrier layer BL and the first magnetic layer L1. In this case, each of the reference layer PL and the free layer FL may include a ferromagnetic material. For example, the reference layer PL may further include an anti-ferromagnetic material for pinning a magnetization direction of the ferromagnetic material.

In some example embodiments, as illustrated in FIG. 6, magnetization directions may be mostly perpendicular to the interface of the barrier layer BL and the first magnetic layer L1. In this case, each of the reference layer PL and the free layer FL may include at least one of a perpendicular magnetic material (e.g., one or more of CoFeTb, CoFeGd, or CoFeDy), a perpendicular magnetic material with an L10 structure, a CoPt-based material with a hexagonal-close-packed-lattice structure, and a perpendicular magnetic structure, or a combination thereof. The perpendicular magnetic material with the L10 structure may include at least one of FePt with the L10 structure, FePd with the L10 structure, CoPd with the L10 structure, or CoPt with the L10 structure, or a combination thereof. The perpendicular magnetic structure may include magnetic layers and non-magnetic layers which are alternately and repeatedly stacked. For example, the perpendicular magnetic structure may include at least one of (Co/Pt) n, (CoFe/Pt) n, (CoFe/Pd) n, (Co/Pd) n, (Co/Ni) n, (CoNi/Pt) n, (CoCr/Pt) n, or (CoCr/Pd) n (n being the number of stacked layers), or a combination thereof. Here, the thickness of the reference layer PL may be greater than the thickness of the free layer FL, or a coercive force of the reference layer PL may be greater than a coercive force of the free layer FL.

In some example embodiments, when a voltage of a relatively high level is applied to the bit line BL1 and a voltage of a relatively low level is applied to the source line SL1, a write current I1 may flow. In this case, the magnetization direction of the second magnetic layer L2 may be the same as the magnetization direction of the first magnetic layer L1, and the MTJ element may have a low resistance value (e.g., a parallel state).

In contrast, when a voltage of a relatively high level is applied to the source line SL1 and a voltage of a relatively low level is applied to the bit line BL1, a write current I2 may flow. In this case, the magnetization direction of the second magnetic layer L2 may be opposite to the magnetization direction of the first magnetic layer L1, and the MTJ element may have a great resistance value (e.g., an anti-parallel state).

In some example embodiments, when the MTJ element is in the parallel state, the memory cell MC may be regarded as storing data of a first value (e.g., logic "0"). In contrast, when the MTJ element is in the anti-parallel state, the memory cell MC may be regarded as storing data of a second value (e.g., logic "1").

Meanwhile, one cell transistor CT is only illustrated in FIGS. 5 and 6, but the components illustrated in FIGS. 5 and 6 may also be applied to the memory cell of FIG. 4. In this case, the cell transistors CT1 and CT2 may be connected to the first end of the MTJ element. The basic principle, operation, etc. of the MTJ element may be identically applied to the memory cell of FIG. 4 except that a current path changes depending on a cell transistor turned on from among the cell transistors CT1 and CT2.

Figure 7:
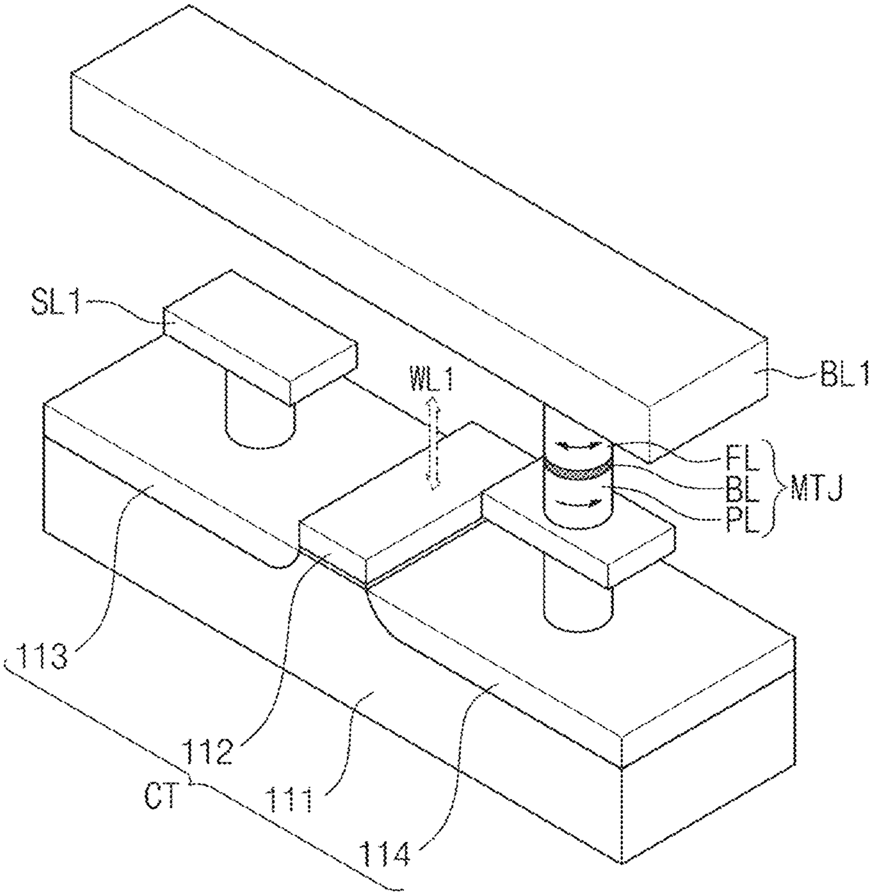
FIG. 7 is a conceptual diagram illustrating a configuration associated with a memory cell of FIG. 3.

FIG. 7 is a conceptual diagram illustrating a configuration associated with a memory cell of FIG. 3.

The cell transistor CT may include a body substrate 111, a gate electrode 112, and junctions 113 and 114. The junction 113 may be formed on the body substrate 111 and may be connected to the source line SL1. The junction 114 may be formed on the body substrate 111 and may be connected to the bit line BL1 through the MTJ element. The gate electrode 112 may be formed on the body substrate 111 between the junctions 113 and 114 and may be connected to the word line WL1. Meanwhile, the configuration of FIG. 7 is provided as an example. Like the embodiment described with reference to FIG. 4, when two cell transistors share one MTJ element, a modified version of the configuration illustrated in FIG. 7 may be adopted.

Figure 8:
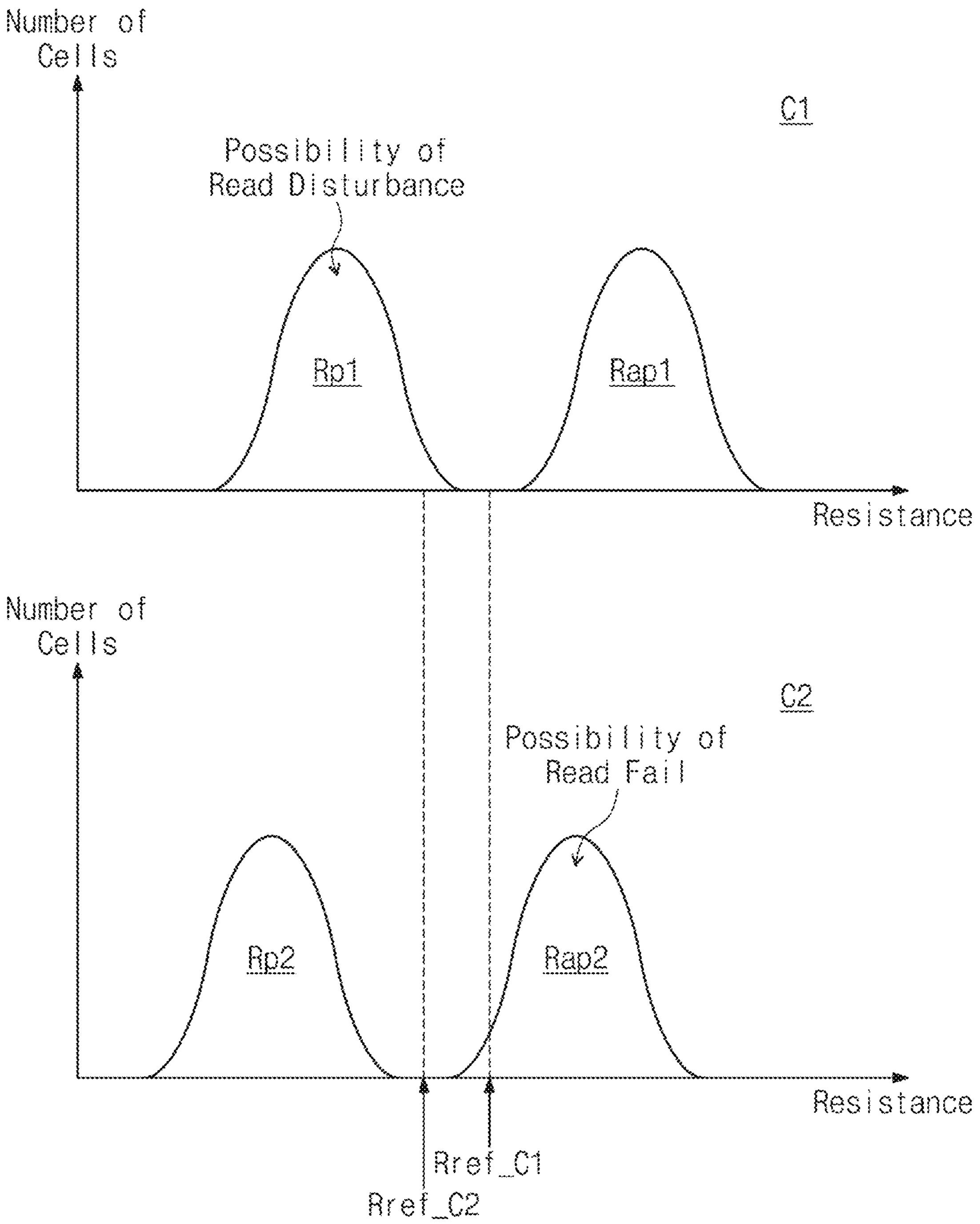
FIG. 8 illustrates a graph associated with a program state of a memory cell of FIG. 5 or 6.

FIG. 8 illustrates a graph (a histogram) associated with a program state of a memory cell of FIG. 5 or 6.

Like the brief description given with reference to FIG. 1, the read characteristics of the memory chips C1 and C2 manufactured from the same substrate 1 may be different from each other due to various process issues such as varying lithography and/or etch processes. For example, a resistance distribution diagram corresponding to the first memory chip C1 may be different from a resistance distribution diagram corresponding to the second memory chip C2. For example, when the size of the MRAM cell constituting the first memory chip C1 is smaller than the size of the MRAM cell constituting the second memory chip C2, a resistance value of the MRAM cell of the first memory chip C1 may be mostly greater than a resistance value of the MRAM cell of the second memory chip C2.

Alternatively or additionally, a value of a read voltage (or current) necessary or used to perform the read operation on the MRAM cell of the first memory chip C1 may be mostly smaller than a value of a read voltage (or current) necessary or used to perform the read operation on the MRAM cell of the second memory chip C2. However, in some example embodiments, when the size of the MRAM cell constituting the first memory chip C1 is larger than the size of the MRAM cell constituting the second memory chip C2, the resistance characteristic and the read voltage characteristic may be opposite to those described above.

Referring to the graph corresponding to the first memory chip C1, a resistance distribution Rp1 of memory cells programmed to the parallel state and a resistance distribution Rap1 of memory cells programmed to the anti-parallel state may be distinguished by a first reference resistance Rref_C1. In some example embodiments, in the read operation, the resistance distributions Rp1 and Rap1 may be distinguished by the read voltage corresponding to the first reference resistance Rref_C1.

Referring to the graph corresponding to the second memory chip C2, a resistance distribution Rp2 of memory cells programmed to the parallel state and a resistance distribution Rap2 of memory cells programmed to the anti-parallel state may be distinguished by a second reference resistance Rref_C2. In some example embodiments, in the read operation, the resistance distributions Rp2 and Rap2 may be distinguished by the read voltage corresponding to the second reference resistance Rref_C2.

However, a magnitude of the read voltage corresponding to the first reference resistance Rref_C1 may be somewhat small to determine a program state of memory cells in the second memory chip C2. The reason may be that a relatively great read voltage is required or used to determine the program state of the memory cells of the second memory chip C2, the size of which is relatively large. In some cases, the read fail may occur when the read operation on the memory cells of the second memory chip C2 is performed by using the voltage of the relatively small value corresponding to the first reference resistance Rref_C1.

In contrast, a magnitude of the read voltage corresponding to the second reference resistance Rref_C2 may be somewhat great to determine a program state of memory cells of the first memory chip C1. The reason may be that a relatively small read voltage is required to determine the program state of the memory cells of the first memory chip C1, the size of which is relatively small. In some cases, when the read operation on the first memory chip C1 is performed by using the read voltage of the relatively great value corresponding to the second reference resistance Rref_C2, the read disturbance may occur due to a switch of a spin state of a memory cell.

As a result, an unintended issue may occur when the read operation on the memory chips C1 and C2 manufactured from one wafer 1 (refer to FIG. 1) is performed by using the same read voltage.

Figure 9:
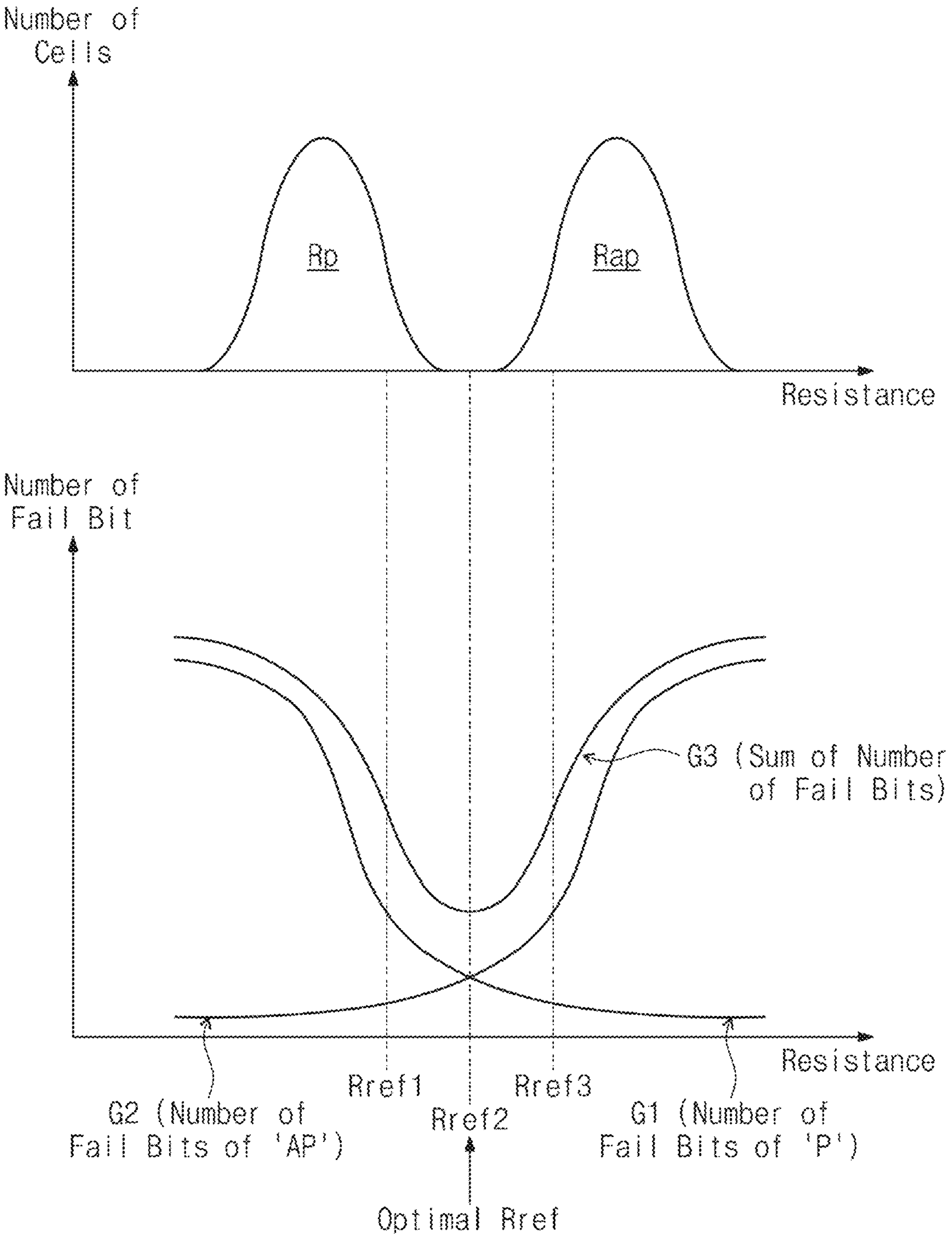
FIG. 9 conceptually illustrates how to determine an optimal reference resistance value corresponding to an optimal program voltage value of a memory device, according to various example embodiments.

FIG. 9 conceptually illustrates how to determine a good (or an optimal) reference resistance value corresponding to an optimal program voltage value of a memory device, according to various example embodiments.

Referring to FIG. 9, in the test operation of a memory device, a pre-program operation of the memory device may be performed. Herein, the pre-program operation may not indicate an operation for storing data, but may indicate a program operation for searching for an optimal reference resistance value for distinguishing the parallel state and the anti-parallel state in the process of testing the memory device. For example, a program voltage which is applied to the memory device in the pre-program operation may be higher in level (in absolute value) than a program voltage which is used in a normal program operation after the product shipping. This may be associated with preventing or reducing the likelihood to have the program fail to accurately perform the test operation.

Some or all of the memory cells of the memory device may be programmed to the parallel state by using a test device (e.g., automatic test equipment (ATE)). In some cases, a pattern such as an "all-0's" pattern or a checkerboard pattern may be programmed. In FIG. 9, "Rp" indicates a distribution of resistance values of memory cells programmed to the parallel state. Afterwards, the number of fail bits of the memory device may be counted by using the test device. For example, when the write operation is performed by using the write voltage corresponding to a reference resistance (e.g., a first reference resistance Rref1) of a relatively small value, the number of fail bits may be very great. As a value of the reference resistance becomes greater (or as a value of the write voltage becomes smaller), the number of fail bits of the memory device may decrease. A graph indicated by "G1" shows the tendency of the number of counted fail bits.

Some or all of the memory cells of the memory device may be programmed to the anti-parallel state by using the test device (e.g., the ATE). In some cases, a pattern such as an "all-1's" pattern or a checkerboard pattern may be programmed. In FIG. 9, "Rap" indicates a distribution of resistance values of memory cells programmed to the anti-parallel state. Afterwards, the number of fail bits of the memory device may be counted by using the test device. For example, when the write operation is performed by using a write voltage corresponding to a reference resistance (e.g., the first reference resistance Rref1) of a relatively small value, the number of fail bits may be very small. However, as a value of the reference resistance becomes greater (or as a value of the write voltage becomes smaller), the number of fail bits of the memory device may increase. A graph indicated by "G2" shows the tendency of the number of counted fail bits.

The test device may determine a good or an optimal reference resistance value by using the number of counted fail bits. For example, the test device may sum the graph G1 indicating the number of fail bits measured in the parallel state and the graph G2 indicating the number of fail bits measured in the anti-parallel state. A graph indicated by G3 may be drawn as a sum result. In the graph indicated by G3, a resistance value (e.g., Rref2) corresponding to the smallest number of fail bits may be an optimal reference resistance value of the memory device.

The test device may determine a good or an optimal read voltage value for the memory device, based on the optimal reference resistance value (e.g., Rref2). A value of the read voltage may be drawn from the tendency of the size of the MRAM cell measured in advance, a reference resistance value according to the size of the MRAM cell, and a value of the write voltage according to the reference resistance value.

In some example embodiments, the case where the good or optimal reference resistance value is relatively small (e.g., Rref1) may indicate that the size of the MRAM cell of the memory device is relatively large, which may indicate that a write voltage of a relatively great value is required or useful. In contrast, the case where the good or optimal reference resistance value is relatively great (e.g., Rref3) may indicate that the size of the MRAM cell of the memory device is relatively small, which may indicate that a write voltage of a relatively small value is required.

Assuming that the above conditions are applied to the first memory chip C1 and the second memory chip C2, there may be concluded that a good or an optimal reference resistance value of the first memory chip C1 is relatively great (e.g., Rref3) and thus a read voltage of a relatively small value is required or useful in the read operation of the first memory chip C1. As in the above description, there may be concluded that a good or an optimal reference resistance value of the second memory chip C2 is relatively small (e.g., Rref1) and thus a read voltage of a relatively great value is or useful in the read operation of the second memory chip C2.

Figure 10:
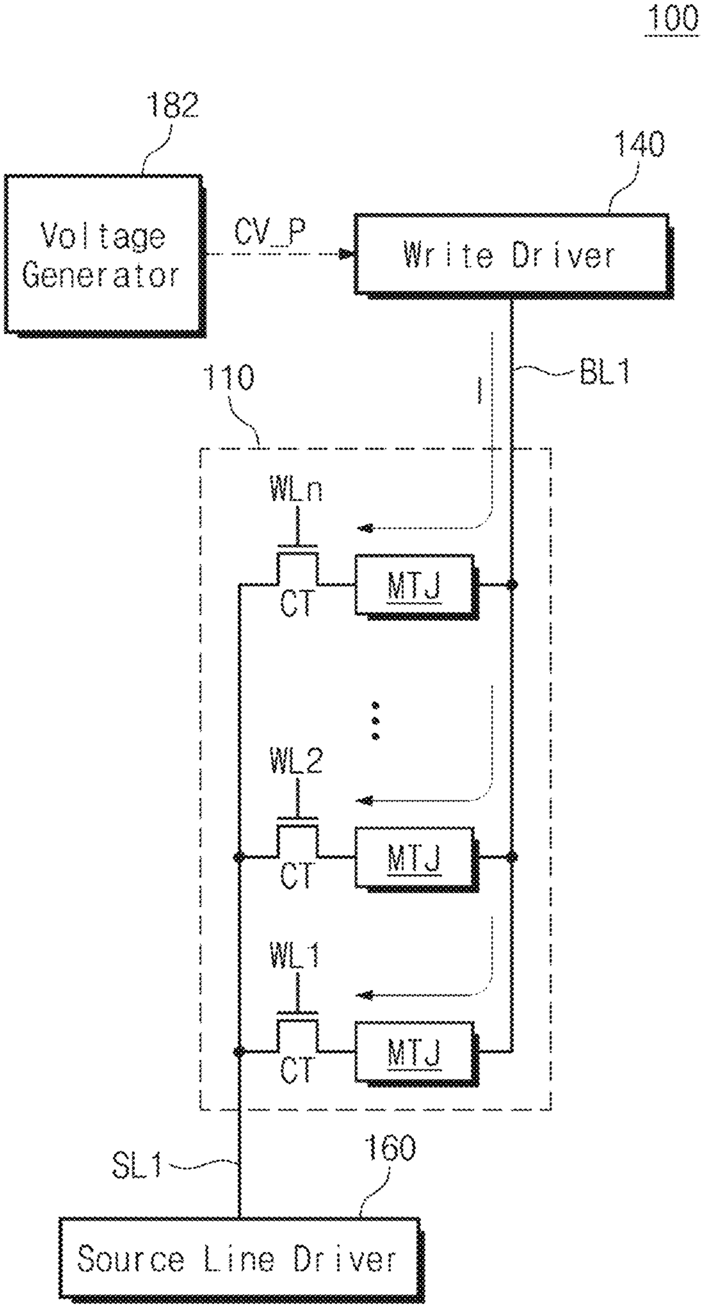
FIG. 10 illustrates a configuration of a memory device associated with a pre-program operation described with reference to FIG. 9.

FIG. 10 illustrates a configuration of a memory device associated with a pre-program operation described with reference to FIG. 9.

The memory cell array 110 may include a plurality of memory cells each including an MTJ element and a cell transistor. The write driver 140, the source line driver 160, and a voltage generator 182 are illustrated together with the memory cell array 110. For example, the voltage generator 182 may be a part of the control logic circuit and voltage generator 180 of FIG. 2. For convenience of description and for brevity of drawing, there are only illustrated "n" memory cells connected to the first bit line BL1 and the first source line SL1.

The voltage generator 182 may be configured to generate a voltage for performing the pre-program operation on the memory cell array 110. Herein, the expression "voltage for the pre-program operation" may mean a voltage whose level is sufficiently high to such an extent that the program fail does not occur at memory cells. For example, a value of the voltage for performing the pre-program operation may be greater than a value of a program voltage which is used in a normal program operation capable of being performed by the end user, but example embodiments are not limited thereto. For example, a value of the voltage for performing the pre-program operation may be implemented by a code value CV_P for turning on/off respective elements (e.g., respective transistors) constituting the write driver 140.

The write driver 140 may perform the pre-program operation on memory cells based on the code value CV_P. The pre-program operation may include programming the memory cells to have the parallel state and programming the memory cells to have the anti-parallel state. For example, the write driver 140 may output a write current "I" (and/or a write voltage) corresponding to the code value CV_P. For example, the write driver 140 may include a driver circuit configured to generate the write current "I" to perform the pre-program operation on the memory cells.

Figure 11:
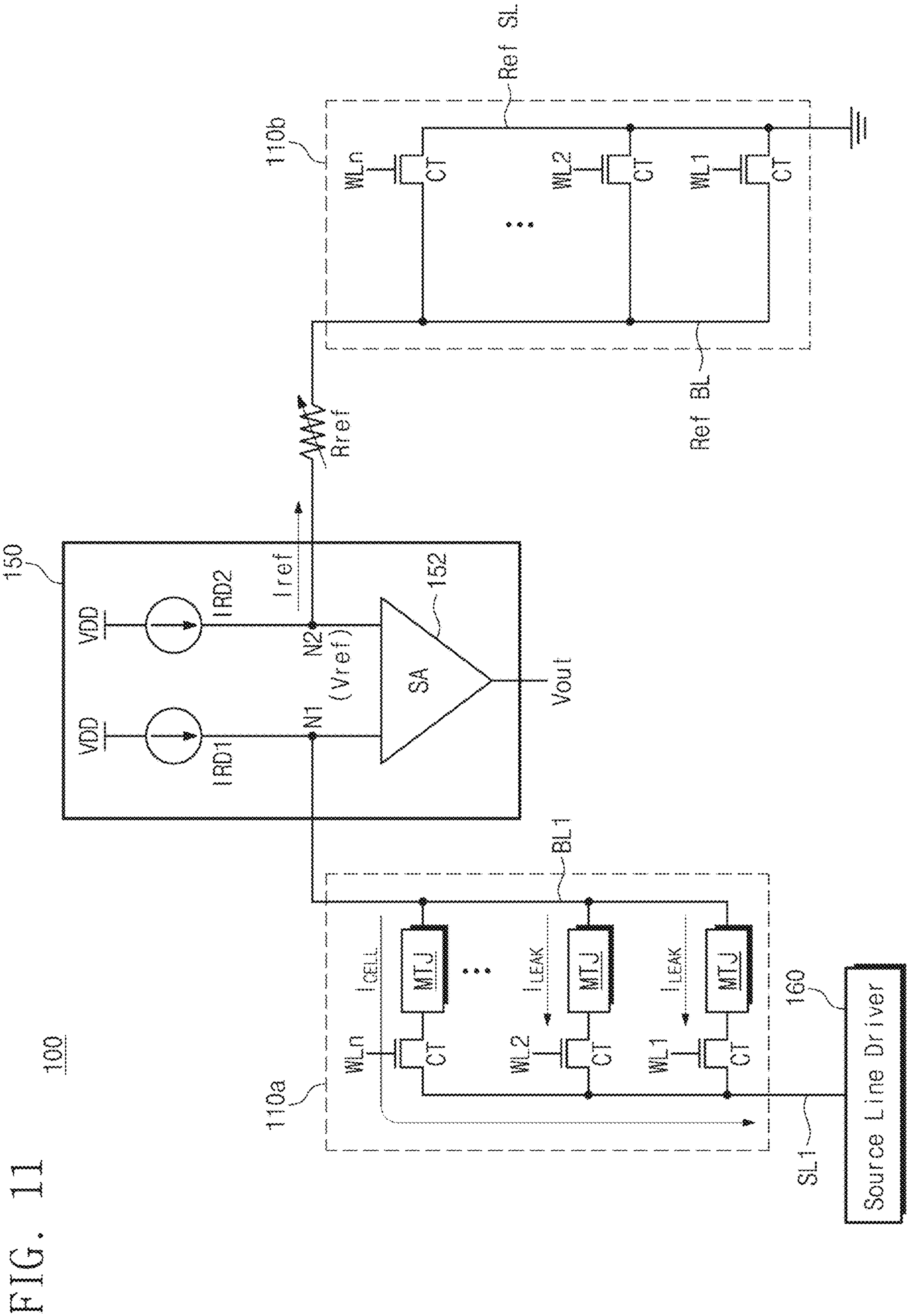
FIG. 11 illustrates a configuration of a memory device associated with a fail bit counting operation described with reference to FIG. 9.

FIG. 11 illustrates a configuration of a memory device associated with a fail bit counting operation described with reference to FIG. 9.

The memory device 100 may include a memory cell array including (e.g., partitioned into or divided into) a first region 110*a* and a second region 110*b*, the sensing circuit 150, and the source line driver 160.

The first region 110*a* may include memory cells connected to a plurality of bit lines and a plurality of source lines. Each memory cell may include an MTJ element and a cell transistor. Memory cells connected to the first bit line BL1 and the first source line SL1 are only illustrated for brevity of drawing. The first bit line BL1 may be connected to a first node N1, and the first source line SL1 may be connected to the source line driver 160.

The second region 110*b* may include components for generating a reference voltage Vref which is used to read data stored in a memory cell of the first region 110*a*. The second region 110*b* may include a reference bit line Ref BL, a reference source line Ref SL, and a plurality of cell transistors CT. The second region 110*b* may also be referred to as a "dummy region" in that an MTJ element is not included in the second region 110*b*.

The sensing circuit 150 may be configured to read data stored in a memory cell connected to the first bit line BL1. For example, the sensing circuit 150 may include current sources generating a first read current IRD1 and a second read current IRD2, and a sense amplifier 152.

The first read current IRD1 may be used to sense a voltage drop in the selected memory cell of the first bit line BL1. For example, the first read current IRD1 may be input to the MTJ element of the selected memory cell which is connected to a selected word line (e.g., WL2) and the first bit line BL1. As a result, a voltage drop is made by the MTJ element connected to the second word line WL2.

The second read current IRD2 may be used to determine a voltage drop in a reference resistance Rref connected to a second node N2, through the reference bit line Ref BL. For example, the second read current IRD2 may flow through the reference resistance Rref, and thus, a voltage drop may occur at the reference resistance Rref. In some example embodiments, a reference current Iref is illustrated in FIG. 11 to show a current flowing through the reference resistance Rref, but the reference current Iref may be regarded as substantially/mostly the same as the second read current IRD2.

The sense amplifier 152 may sense a voltage difference of the first node N1 and the second node N2 and may amplify the sensed voltage difference. For example, a voltage level of the first node N1 may be different from a voltage level of the second node N2. The amplified voltage difference may be output as an output voltage Vout and may be used to determine the data read from the memory cell.

In some example embodiments, in the process of testing the memory device 100, the number of fail bits of memory cells of the memory cell array 110 may be counted whenever a value of the reference resistance Rref is changed. For example, when the memory cells of the memory cell array 110 are programmed to have the parallel state, the number of fail bits according to a value of the reference resistance Rref may have the tendency corresponding to the graph G1 of FIG. 9; when the memory cells of the memory cell array 110 are programmed to have the anti-parallel state, the number of fail bits according to a value of the reference resistance Rref may have the tendency corresponding to the graph G2 of FIG. 9. The test device may obtain (or draw) the graph G3 based on the graphs G1 and G2 of FIG. 9 and may determine a reference resistance value corresponding to or based on the smallest number of fail bits and a value of the read voltage corresponding thereto.

Figure 12:
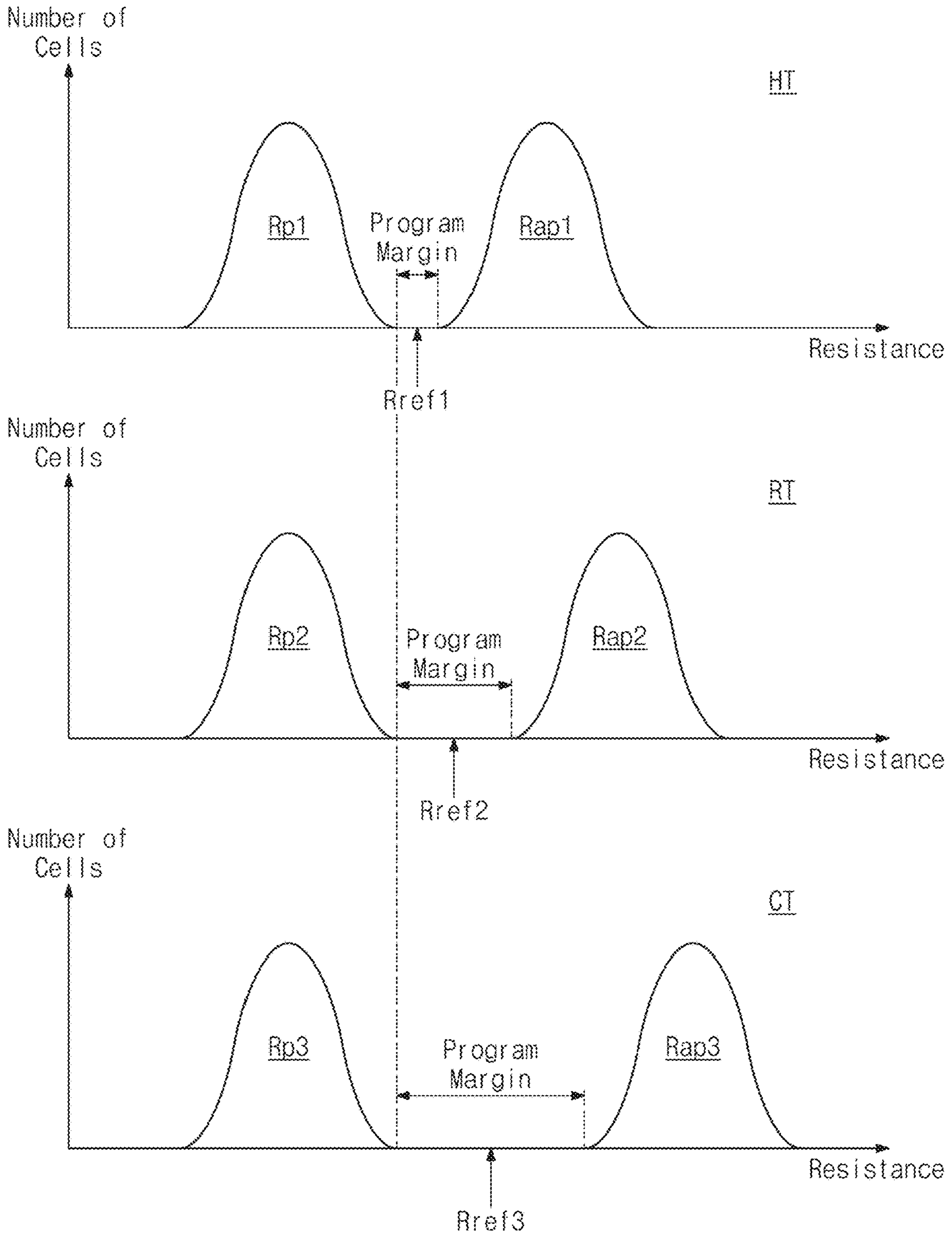
FIG. 12 illustrates a distribution diagram of a program state of a memory cell of FIG. 5 or 6.

FIG. 12 illustrates a distribution diagram of a program state of a memory cell of FIG. 5 or 6.

The distribution of memory cells programmed to the parallel state may be hardly affected by a temperature change. In contrast, the distribution of memory cells programmed to the anti-parallel state may change depending on a temperature. For example, the resistance distribution Rap1 of memory cells programmed to the anti-parallel state at a high temperature HT may be formed to include relatively small resistance values. In this case, the program margin of the resistance distribution Rp1 and the resistance distribution Rap1 may be relatively small. The reference resistance value obtained according to the method described with reference to FIG. 9 may be "Rref1".

In contrast, a resistance distribution Rap3 of memory cells programmed to the anti-parallel state at a cost temperature CT may be formed to include relatively great resistance values. In this case, the program margin of a resistance distribution Rp3 and the resistance distribution Rap3 may be relatively great. The reference resistance value obtained according to the method described with reference to FIG. 9 may be "Rref3".

As in the above description, the resistance distribution Rap2 of memory cells programmed to the anti-parallel state at a room temperature RT may be formed to include intermediate resistance values. For example, the lower limit of the resistance distribution Rap2 may be between the lower limit of the resistance distribution Rap1 and the lower limit of the resistance distribution Rap3, and the upper limit of the resistance distribution Rap2 may be between the upper limit of the resistance distribution Rap1 and the upper limit of the resistance distribution Rap3. In this case, the program margin of the resistance distribution Rp2 and the resistance distribution Rap2 may have a value between the program margin at the high temperature and the program margin at the cold temperature, and the reference resistance value obtained according to the method described with reference to FIG. 9 may be "Rref2".

Meanwhile, when good or optimal reference resistance values obtained in all the temperature zones in the process of testing a memory chip are used to perform the program operation and/or the read operation, the reliability of the memory device may be secured or may be more likely to be secured. However, a lot of time and costs necessary to obtain the good or optimal reference resistance values of all the temperature zones in the test process are required, which may not be efficient. Accordingly, there may be used a method of obtaining a reference resistance value at the room temperature RT and a reference resistance value at the cold temperature CT by using a reference resistance value (e.g., Rref1) at a specific temperature (for example, the high temperature) as a criterion and shifting the reference resistance value Rref1 depending on a temperature change.

Figure 13:
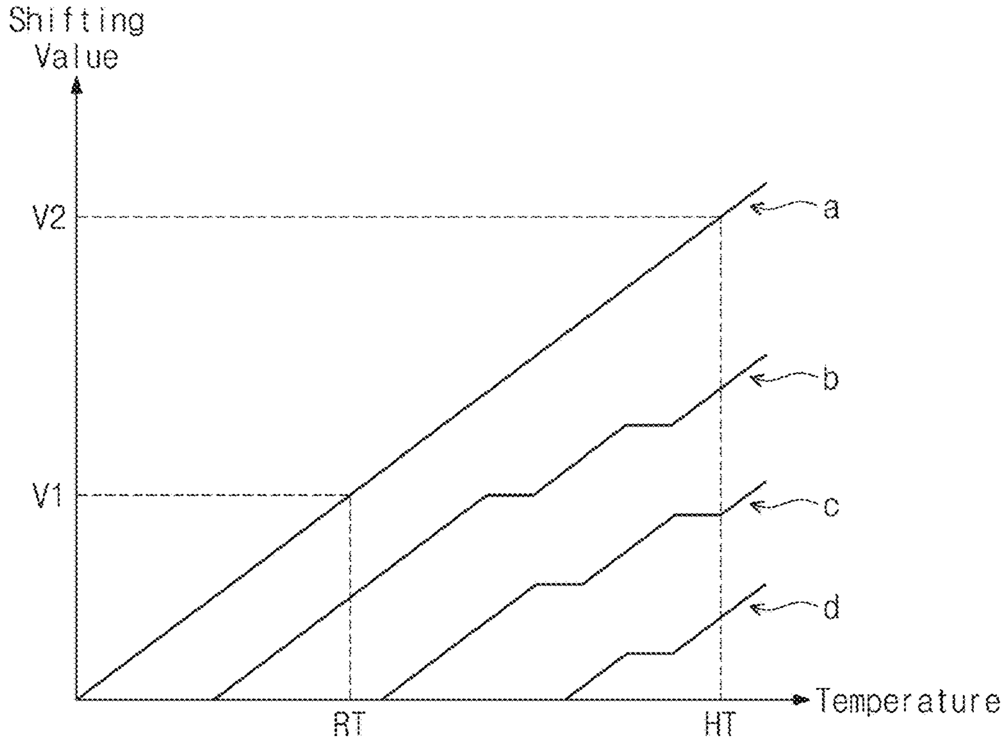
FIG. 13 is a graph illustrating how a reference resistance value is shifted depending on a temperature.

FIG. 13 is a graph illustrating how a reference resistance value is shifted depending on a temperature.

At least one of a plurality of shifting options may be selected in the process of testing a memory chip. The shifting option may be selected based on one or more of a wafer, a lot, a process, etc. in addition to physical characteristics of memory cells constituting or included in a chip, such as a size and/or a resistance. In some example embodiments, four options respectively indicated by "a", "b", "c", and "d" are illustrated, and a shifting value for each option may be mostly linear to a temperature change.

It is assumed that a shifting graph indicated by "a" is selected in association with a specific memory chip. In some example embodiments, the reference resistance value at the high temperature HT may be set as a default value of the memory chip. For example, the reference resistance value set as the default value may correspond to the first reference resistance Rref1 of FIG. 12. A value obtained by shifting a value of the first reference resistance Rref1 depending on an ambient temperature may be selected as a reference resistance value at a relevant temperature. For example, a reference resistance value at the room temperature RT may be a value obtained by adding the value of the first reference resistance Rref1 and a value of (V2−V1). In an ideal case, the reference resistance value at the room temperature RT may coincide with the value obtained by adding the value of the first reference resistance Rref1 and (V2−V1).

However, unlike the ideal case, the reference resistance value at the room temperature RT obtained through the shifting according to the above method may be different from an actual reference resistance value at the room temperature RT (e.g., a reference resistance value obtained according to the method of FIG. 9 at a room temperature). In some cases, a skew may exist between a reference resistance value of a specific temperature obtained through the shifting and an actual reference resistance value of the specific temperature. The skew will be described with reference to FIG. 14.

In some example embodiments, the plurality of shifting options or at least one thereof may be stored in a separate region of a memory device (e.g., an anti-fuse array of a memory device described with reference to FIG. 2). The stored shifting option may be loaded and used when there is a need to shift a reference resistance value depending on an ambient temperature in the program operation and/or the read operation for the memory device.

Figure 14:
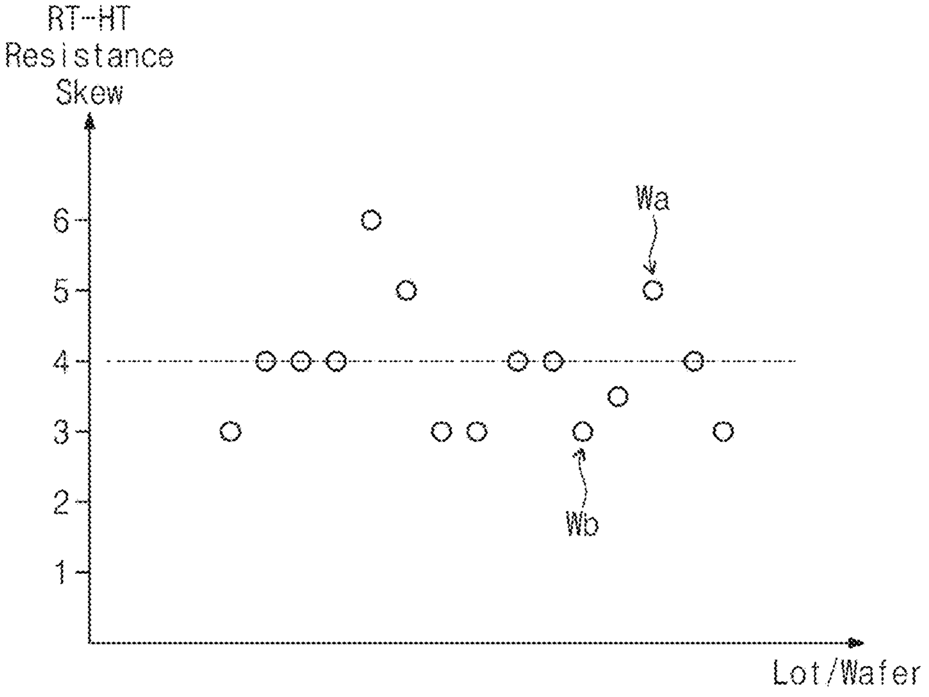
FIG. 14 is a graph illustrating a correlation between an optimal reference resistance value at a room temperature and an optimal reference resistance value at a high temperature.

FIG. 14 is a graph illustrating a correlation between an optimal reference resistance value at a room temperature and an optimal reference resistance value at a high temperature.

In FIG. 14, the horizontal axis represents a wafer number or a lot number, and the vertical axis represents a difference (e.g., a skew) between an actual reference resistance value at the room temperature and an actual reference resistance value at the high temperature. In some example embodiments, the actual reference resistance value may mean a resistance value obtained by the method described with reference to FIG. 9. Referring to FIG. 14, semiconductor chips may have a skew value corresponding to 3, 4, 5, and 6. However, the numerical values are relative or are provided as an example and do not indicate a difference between actual resistance values. Semiconductor chips may be regarded as generally having a skew value corresponding to "4".

In some example embodiments, in a semiconductor chip of a wafer or lot illustrated in the graph of FIG. 14, a good or an optimal reference resistance value at the room temperature may be obtained by shifting an actual reference resistance value at the high temperature as much as 4 (i.e., by adding the actual reference resistance value at the high temperature and 4). The above process may correspond to the shifting which is made by using the shifting option described with reference to FIG. 13.

However, as illustrated in FIG. 14, any wafer (and/or lot) may have a skew value being not "4"; in this case, to shift a reference resistance value as much as the same value to obtain a reference resistance value at the room temperature in association with the semiconductor chip of the wafer causes the mismatch with an actual reference resistance value.

For example, a wafer (or lot) marked by "Wa" may have a skew value corresponding to "5"; in this case, to add "4" to the reference resistance value at the high temperature to obtain the reference resistance value at the room temperature in association with the semiconductor chip of the wafer Wa causes "under-shifting". For example, the reference resistance value at the room temperature obtained through the shifting may be smaller than the actual reference resistance value.

In contrast, a wafer and/or a lot marked by "Wb" may have a skew value corresponding to "3"; in this case, to add "5" to the reference resistance value at the high temperature to obtain the reference resistance value at the room temperature in association with the semiconductor chip of the wafer Wb causes "over-shifting". For example, the reference resistance value at the room temperature obtained through the shifting may be greater than the actual reference resistance value.

Accordingly, to obtain the reference resistance value at the room temperature by applying the same shifting value (e.g., 4) to the wafer and/or lot illustrated in FIG. 14 may cause the mismatch with the actual reference resistance value at the room temperature, which may cause the read fail, the write fail, etc. in association with the memory chip.

Figure 15:
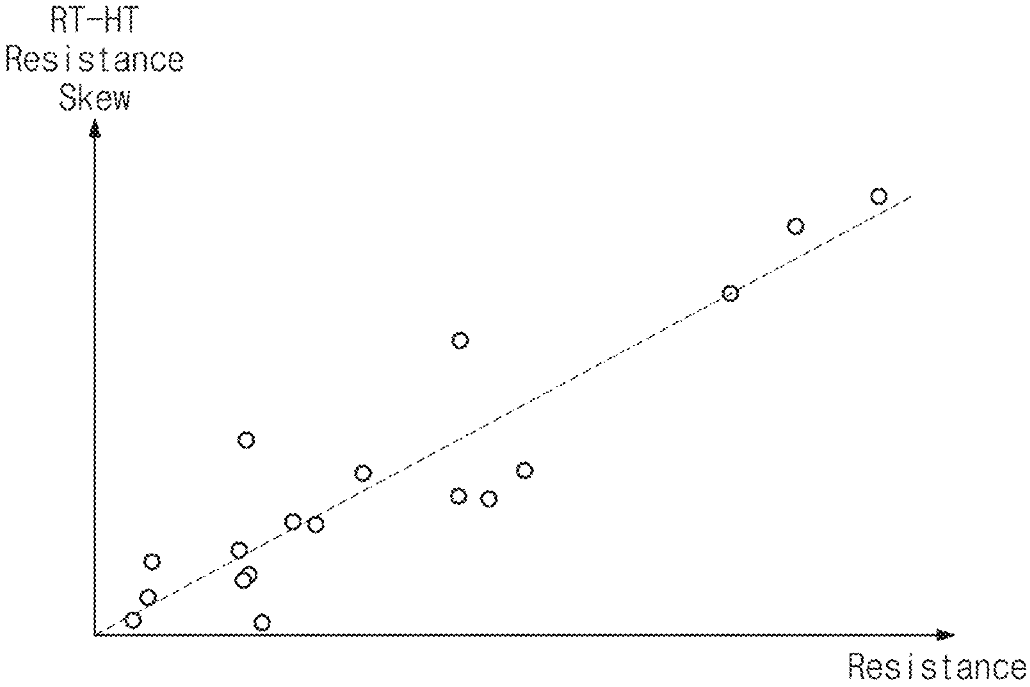
FIG. 15 is a graph illustrating a correlation between the above skew value and a resistance value of memory cells of a memory chip.

FIG. 15 is a graph illustrating a correlation between the above skew value and a resistance value of memory cells of a memory chip.

In detail, in FIG. 15, the horizontal axis represents an average value of the upper limit of the parallel state (e.g., Rp1 of FIG. 1) and the lower limit of the anti-parallel state (e.g., Rap1 of FIG. 1) in a resistance distribution diagram. In FIG. 15, the vertical axis represents a difference (e.g., a skew) between an actual optimal reference resistance value at the room temperature and an actual optimal reference resistance value at the high temperature.

Referring to FIG. 15, that the average value of the upper limit of the parallel state of the resistance distribution diagram and the lower limit of the anti-parallel state of the resistance distribution diagram is great may indicate that a memory cell has a relatively great resistance value. As described with reference to FIG. 8, this may indicate that the size of the memory cell is relatively small. In contrast, that the average value of the upper limit of the parallel state of the resistance distribution diagram and the lower limit of the anti-parallel state of the resistance distribution diagram is small may indicate that a memory cell has a relatively small resistance value, which may mean that the size of the memory cell is relatively large.

As a result, when the size of the memory cell is relatively large, the "under-shifting" may be caused due to a great skew value, as described with reference to FIG. 14. In contrast, when the size of the memory cell is relatively small, the "over-shifting" may be caused due to a small skew value, as described with reference to FIG. 14. According to various example embodiments, thus, reference resistance values at the remaining temperatures other than a reference temperature (e.g., a high temperature) may be obtained in consideration of both shifting based on an ambient temperature and a resistance of a memory cell (or the size of a memory cell). According to the above description, because there is no need to test optimal reference resistance values in all the temperature zones, a test time may be shortened. In addition, because the error caused by the skew difference is capable of being corrected, the reliability of the memory chip may be improved.

Figure 16:
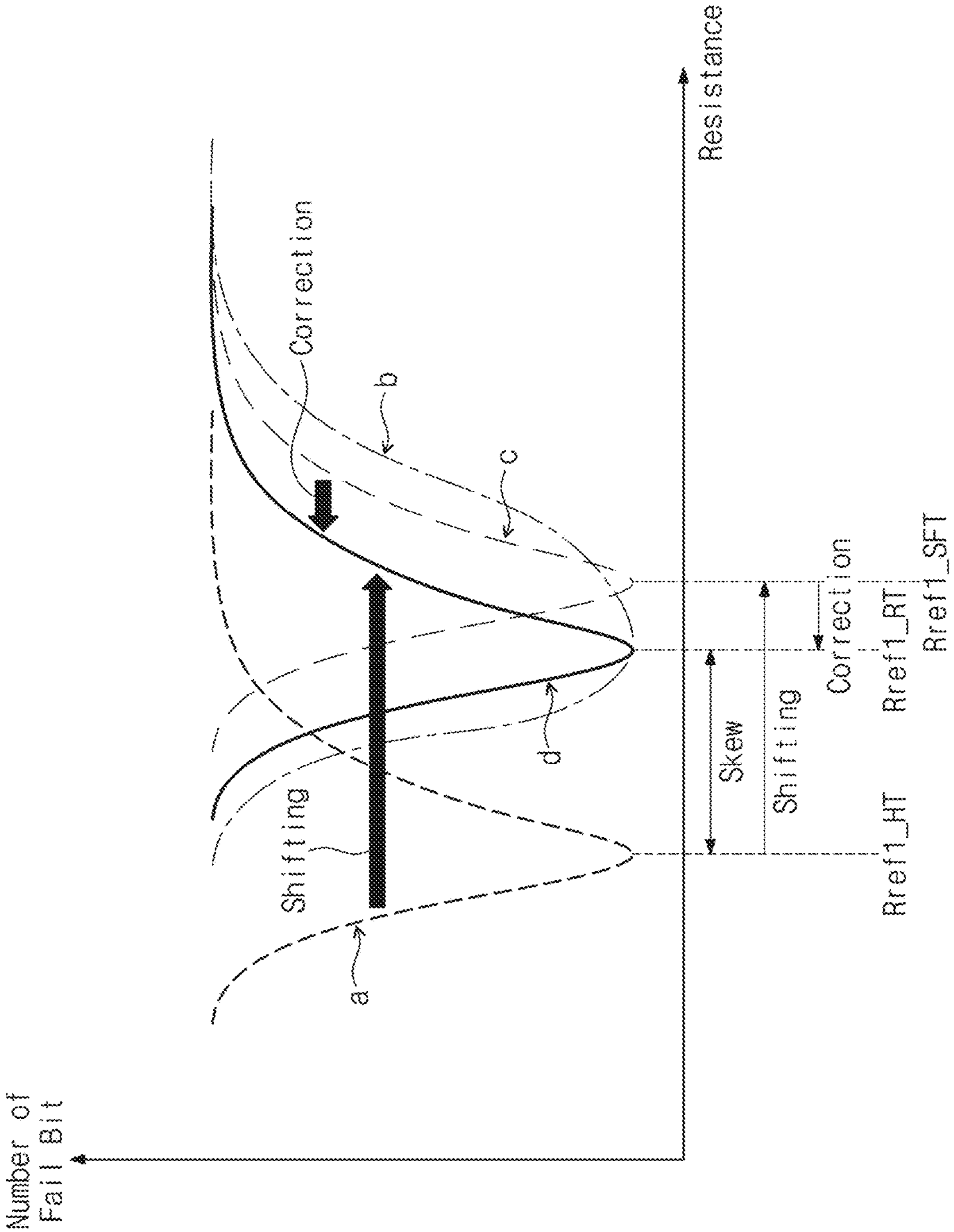
FIG. 16 is a graph illustrating shifting and correction according to various example embodiments.

FIG. 16 is a graph illustrating shifting and correction according to various example embodiments.

Referring to FIG. 16, a graph indicated by "a" refers to a graph illustrating a counting value obtained by counting the number of fail bits which are generated when the reference resistance value at the high temperature HT is used. The number of fail bits may be counted by using the same method as described with reference to FIG. 9. In graph "a", a resistance corresponding to the smallest number of fail bits may be a reference resistance Rref1_HT at the high temperature. A graph indicated by "b" refers to a graph illustrating a counting value obtained by counting the number of fail bits which are generated when the reference resistance value at the room temperature RT is used. In graph "b", a resistance corresponding to the smallest number of fail bits may be a reference resistance Rref1_RT at the room temperature.

Meanwhile, according to various example embodiments, a value of the reference resistance Rref1_HT at the high temperature is obtained by the method described with reference to FIG. 9, but a value of the reference resistance Rref1_RT at the room temperature is not obtained by the method described with reference to FIG. 9. Instead, according to various example embodiments, a reference resistance value at the room temperature may be obtained by shifting the value of the reference resistance Rref1_HT. A graph indicating a counting value obtained by counting the number of fail bits which are generated when the reference resistance value at the room temperature obtained through shifting is used is a graph indicated by "c".

However, an actual value of the reference resistance Rref1_RT at the room temperature may be different from a value of a reference resistance Rref1_SFT obtained through the shifting due to various causes such as a resistance value of a memory cell. For example, the value of the reference resistance Rref1_SFT obtained through the shifting may be greater than the value of the reference resistance Rref1_RT at the room temperature. Accordingly, the memory device of the present disclosure performs correction by further considering a resistance of a memory cell in addition to the shifting performed based on an ambient temperature. In this case, a result of performing the shifting for the reference resistance Rref1_HT at the high temperature may almost coincide with an actual reference resistance value at the room temperature.

Figure 17:
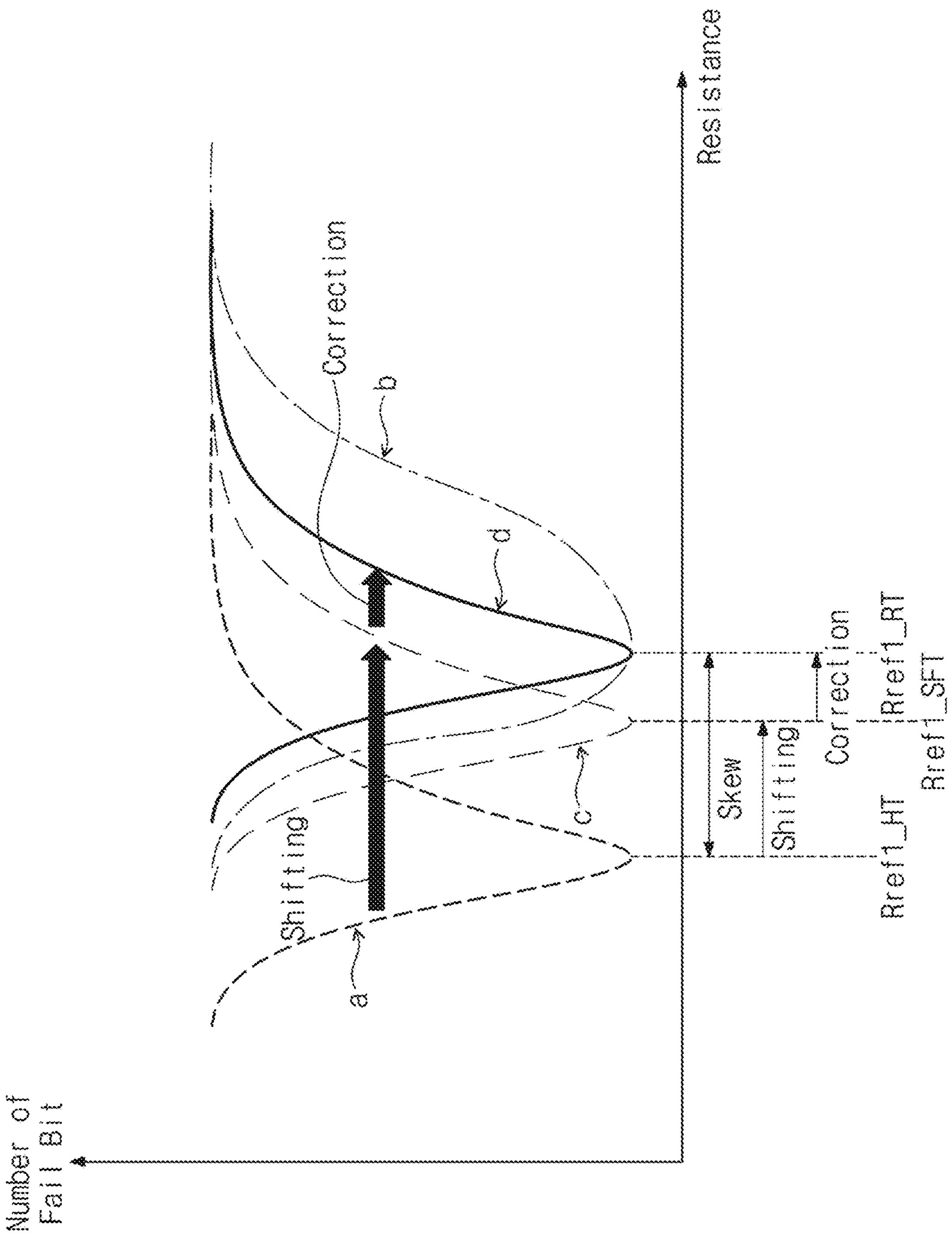
FIG. 17 is a graph illustrating shifting and correction according to various example embodiments.

FIG. 17 is a graph illustrating shifting and correction according to various example embodiments.

Graphs illustrated in FIG. 17 are mostly similar to the graphs illustrated in FIG. 16. However, a shifting value of FIG. 17 may be smaller than a shifting value of FIG. 16. It may be understood that the shifting is performed based on another shifting option among the plurality of shifting options illustrated in FIG. 13.

Referring to FIG. 17, a graph indicated by "a" refers to a graph illustrating a counting value obtained by counting the number of fail bits which are generated when the reference resistance value at the high temperature HT is used, and a graph indicated by "b" refers to a graph illustrating a counting value obtained by counting the number of fail bits which are generated when the reference resistance value at the room temperature RT is used.

According to the above method, a value of the reference resistance Rref1_SFT at the room temperature RT may be obtained by shifting an optimal value of the reference resistance Rref1_HT at the high temperature HT. However, because the value of the reference resistance Rref1_SFT is smaller than the actual value of the reference resistance Rref1_RT at the room temperature, the memory device of the present disclosure performs correction in consideration of the size of a memory cell. In this case, a result of performing the shifting for the reference resistance Rref1_HT at the high temperature may almost coincide with an actual reference resistance value at the room temperature.

Meanwhile, in the embodiments of FIGS. 16 and 17, a correction value which is used for correction after the shifting is performed may be determined in advance in consideration of a resistance of memory cells constituting a memory chip in the process of testing the memory chip. Information about the correction value may be stored in a separate region of a memory device (e.g., an anti-fuse array of a memory device described with reference to FIG. 2). The stored correction value may be loaded and used when there is a need to shift a reference resistance value depending on an ambient temperature.

Figure 18:
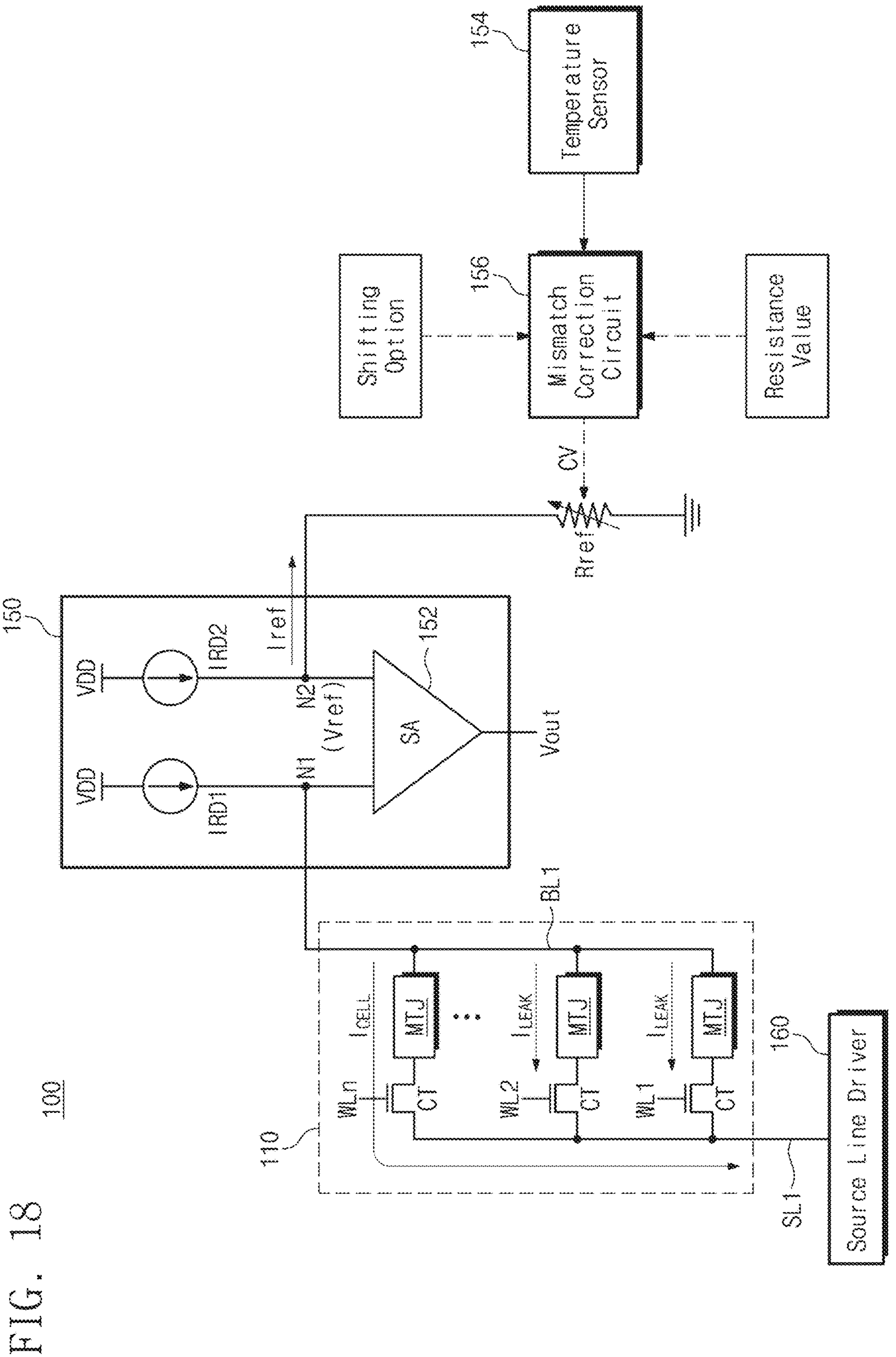
FIG. 18 illustrates a configuration of a memory device associated with obtaining a reference resistance value of a memory device, according to various example embodiments.

FIG. 18 illustrates a configuration of a memory device associated with obtaining a reference resistance value of a memory device, according to various example embodiments.

Some example embodiments, e.g., as illustrated in FIG. 18 shows a circuit for obtaining a reference resistance value at any other temperature by shifting an optimal reference resistance value at a specific temperature (e.g., a high temperature). The memory device 100 may include the memory cell array 110, the sensing circuit 150, and the source line driver 160. A configuration and an operation of the memory device 100 are mostly similar to the configuration and the operation of the memory device 100 described with reference to FIG. 11. Thus, additional description will be omitted to avoid redundancy.

In various example embodiments, a value of the reference resistance Rref determined according to the method described with reference to FIG. 9 in the process of testing the memory device 100 may be a reference resistance value at the high temperature HT. Accordingly, the memory device 100 may further include a temperature sensor 154 and a mismatch correction circuit 156 for shifting and correcting the reference resistance value at the high temperature, in addition to the components illustrated in FIG. 11.

The temperature sensor 154 may measure an ambient temperature. The temperature sensor 154 may provide information about the measured temperature to the mismatch correction circuit 156.

The mismatch correction circuit 156 may be configured to shift the reference resistance value at the high temperature based on the shifting option and the ambient temperature. The shifting option may include information about a shifting value corresponding to the ambient temperature as described with reference to FIG. 13. The mismatch correction circuit 156 may receive the shifting option from the outside (e.g., the memory cell array 110 of FIG. 2). However, example embodiments are not limited thereto. For example, the mismatch correction circuit 156 may store the shifting option and may load the shifting option when the shifting is required.

The mismatch correction circuit 156 may correct the shifted reference resistance value at the high temperature, based on a resistance value of a memory cell. In some example embodiments, a table which defines a correction value corresponding to a resistance value of a memory cell may be used. The table may be stored inside or outside the mismatch correction circuit 156 and may be used when the mismatch correction circuit 156 operates.

After the mismatch correction circuit 156 performs the shifting and correction operations, the mismatch correction circuit 156 may generate a code value CV for varying a value of the reference resistance Rref based on the shifting result and the correction result.

The reference resistance Rref may be associated with a voltage necessary to read data stored in the memory cell of the memory cell array 110 or to program data in the memory cell of the memory cell array 110. The reference resistance Rref may be a variable resistance, and a value of the reference resistance Rref may be changed based on the code value CV received from the mismatch correction circuit 156. For example, the reference resistance Rref may be implemented by using metal, polysilicon, etc., but example embodiments are not limited thereto.

Figure 19:
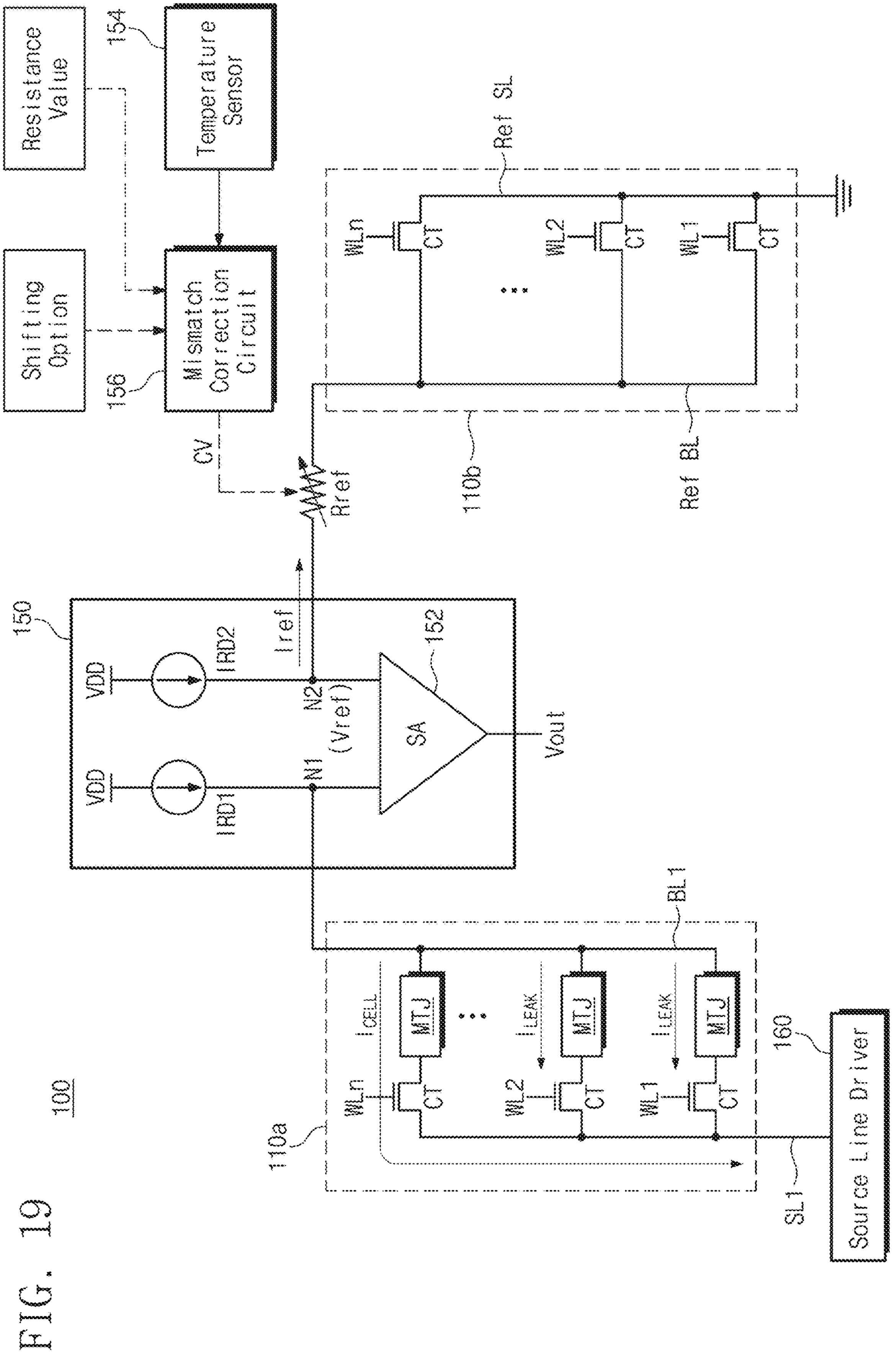
FIG. 19 illustrates a configuration of a memory device associated with obtaining a reference resistance value of a memory device, according to various example embodiments.

FIG. 19 illustrates a configuration of a memory device associated with obtaining a reference resistance value of a memory device, according to various example embodiments.

A configuration and/or an operation of the memory device 100 are mostly similar to the configuration and the operation of the memory device 100 of FIG. 18. However, the memory cell array may include the first region 110*a* and the second region 110*b*, and the first region 110*a* may be substantially the same as the memory cell array 110 of FIG. 18. The second region 110*b* may be provided between the reference resistance Rref and a ground electrode. The second region 110*b* may include components for generating the reference voltage Vref which is used to read data stored in the memory cell of the first region 110*a*. The second region 110*b* may include the reference bit line Ref BL, the reference source line Ref SL, and the plurality of cell transistors CT.

In addition, configurations and operations of the sensing circuit 150, the temperature sensor 154, and the mismatch correction circuit 156 are mostly similar to those described with reference to FIG. 18, and thus, additional description will be omitted to avoid redundancy.

Figure 20:
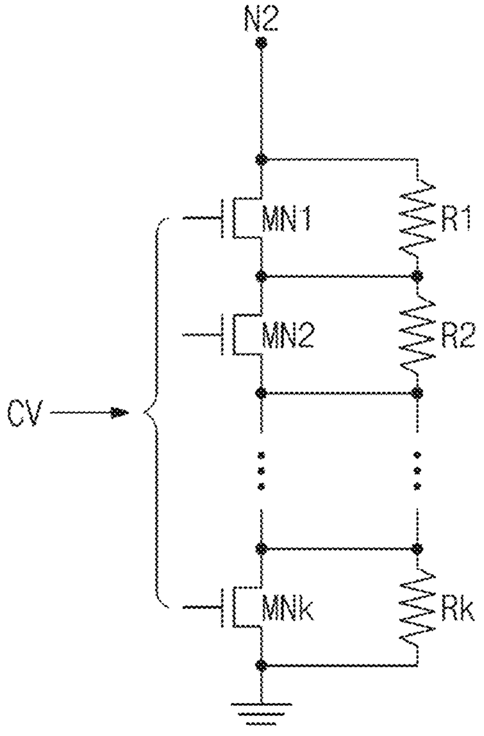
FIG. 20 illustrates a configuration of a reference resistance of FIGS. 18 and 19.

FIG. 20 illustrates a configuration of the reference resistance Rref of FIGS. 18 and 19.

The reference resistance Rref may be implemented such that a resistance value thereof is changed based on the code value CV. To this end, the reference resistance Rref may include a plurality of transistors MN1 to MNk and a plurality of resistances R1 to Rk. The plurality of transistors MN1 to MNk may be individually turned on or turned off by the code value CV. When a transistor is turned on, a current may flow from the second node N2 to the ground electrode; in this case, it may be regarded that no current flows through a resistance connected between opposite ends of the turned-on transistor. For example, when the transistor MN1 is turned off by the code value CV and the remaining transistors MN2 to MNk are turned on by the code value CV, a path of a current flowing from the second node N2 to the ground electrode may be "R1-MN2- . . . -MNk", and a value of the reference resistance Rref may be "R1".

However, the configuration of the reference resistance Rref is not limited to the example illustrated in FIG. 18, and various configurations in which a resistance value is changed based on the code value CV may be adopted.

Figure 21:
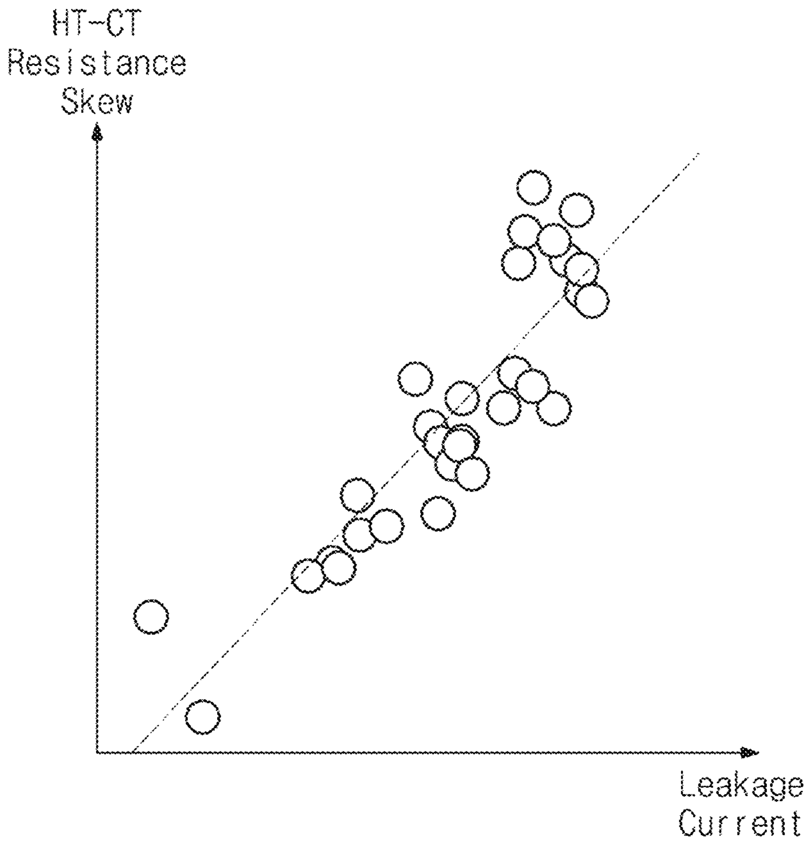
FIG. 21 is a graph illustrating a correlation between a skew value of reference resistances at a room temperature and a high temperature and a leakage current of a memory cell.

FIG. 21 is a graph illustrating a correlation between a skew value of reference resistances at a room temperature and a high temperature and a leakage current of a memory cell.

In detail, in FIG. 21, the horizontal axis represents a magnitude of a leakage current flowing to a memory cell, which is not targeted for the read operation or the write operation, from among memory cells connected to one bit line. In FIG. 21, the vertical axis represents a difference (i.e., a skew) between an actual reference resistance value at the room temperature and an actual reference resistance value at the high temperature. In some example embodiments, the actual reference resistance value may mean a resistance value obtained by the method described with reference to FIG. 9.

Referring to FIG. 21, the difference (i.e., skew) between an actual reference resistance value at the room temperature and an actual optimal reference resistance value at the high temperature may be mostly proportional to the magnitude of the leakage current of the memory cell. Accordingly, when the leakage current is great, the "under-shifting" issue may be caused as described with reference to FIG. 14; in contrast, when the leakage current is small, the "over-shifting" issue may be caused as described with reference to FIG. 14. According to various example embodiments, thus, reference resistance values at the remaining temperatures other than a reference temperature (e.g., a high temperature) may be obtained in consideration of both the shifting based on an ambient temperature and a magnitude of a leakage current flowing to a memory cell.

Figure 22:
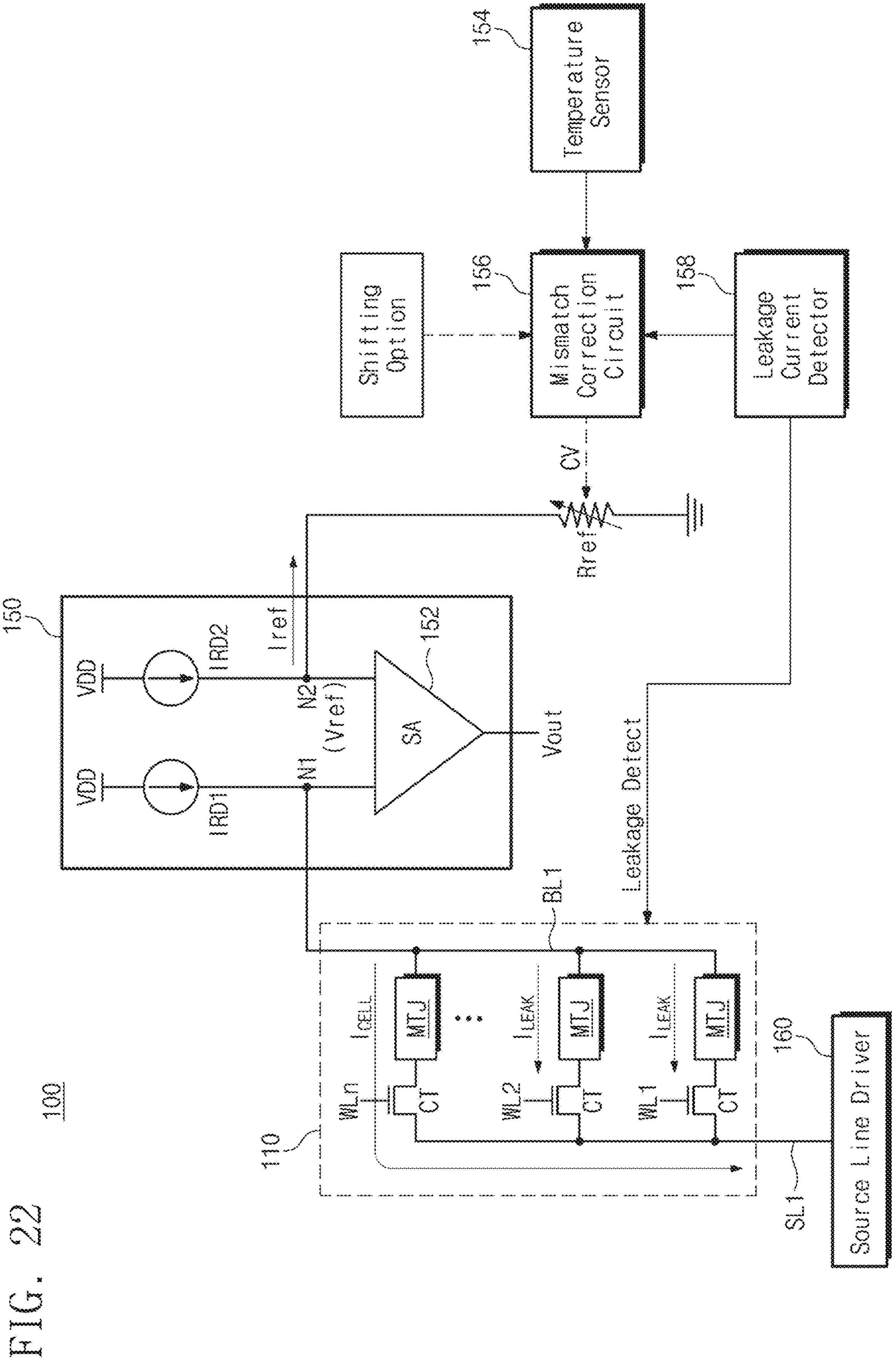
FIG. 22 illustrates a configuration of a memory device associated with obtaining a reference resistance value of a memory device, according to various example embodiments.

FIG. 22 illustrates a configuration of a memory device associated with obtaining a reference resistance value of a memory device, according to various example embodiments.

The memory device 100 may include the memory cell array 110, the sensing circuit 150, the temperature sensor 154, the mismatch correction circuit 156, a leakage current detector 158, and the source line driver 160. Configurations and operations of the memory cell array 110, the sensing circuit 150, the temperature sensor 154, the mismatch correction circuit 156, and the source line driver 160 are mostly the same as those described with reference to FIG. 18, and thus, additional description will be omitted to avoid redundancy.

The leakage current detector 158 may detect a leakage current flowing to memory cells, which belong to a path being not a data path, from among memory cells connected to the bit line BL1. In some example embodiments, the data path may mean a path where the read operation or the write operation is performed. The leakage current detector 158 may provide information about the detected leakage current to the mismatch correction circuit 156.

The mismatch correction circuit 156 may be configured to shift the reference resistance value at the high temperature based on the shifting option and the ambient temperature. The mismatch correction circuit 156 may correct the shifted reference resistance value at the high temperature, based on the information about the leakage current received from the leakage current detector 158. In some example embodiments, a table which defines a correction value corresponding to a value of a leakage current may be used. The table may be stored inside or outside the mismatch correction circuit 156 and may be used when the mismatch correction circuit 156 operates.

In some cases, the memory device 100 may further include components for generating a reference voltage necessary to read data stored in the memory cell of the memory cell array 110. For example, the memory device 100 may further include a reference bit line, a reference source line, and cell transistors connected between the reference resistance Rref and the ground electrode, the configuration of which is similar to that of the second region **110*b* illustrated in FIG. 19**.

Figure 23:
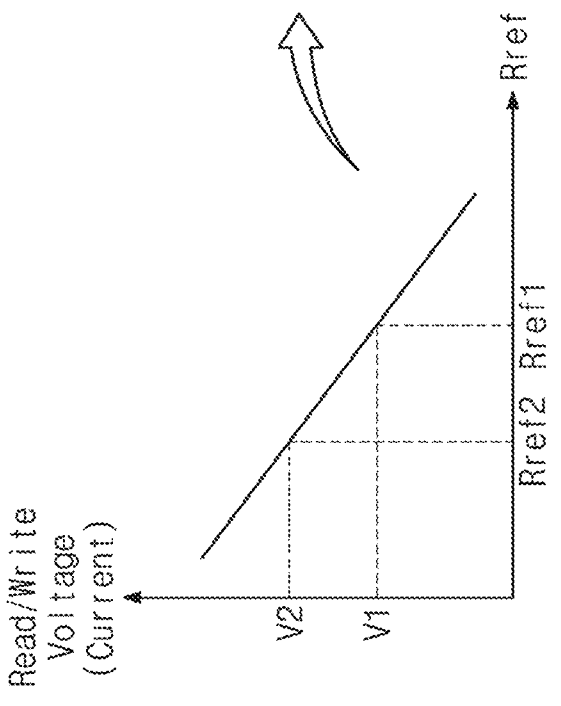
FIG. 23 illustrates a relationship between a reference resistance value and a value of a read voltage or a write voltage corresponding to the reference resistance value.

FIG. 23 illustrates a relationship between a reference resistance value and a value of a read voltage or a write voltage corresponding to the reference resistance value.

In some example embodiments, a reference resistance value of a memory device may be inversely proportional to a value of a read/write voltage (or current) of the memory device, which corresponds to the reference resistance value. However, the reference resistance value of the memory device may not be accurately inversely proportional to an optimal value of the read/write voltage corresponding thereto. It should be understood that the value of the read/write voltage corresponding thereto decreases as the reference resistance value increases.

A graph of FIG. 23 shows that the first reference resistance Rref1 of a relatively great value corresponds to an MRAM cell of a relatively small size and the read/write voltage corresponding thereto has a relatively small value V1. In contrast, the graph of FIG. 23 shows that the second reference resistance Rref2 of a relatively small value corresponds to an MRAM cell of a relatively large size and the read/write voltage corresponding thereto has a relatively great value V2.

In some example embodiments, each of a value of a reference resistance and a value of a read/write voltage (or current) may be expressed by 4 bits, but example embodiments are not limited thereto. In the case where the reference resistance value is expressed by 4 bits, the fail bit counting operation described with reference to FIG. 9 may be performed as much as 16 times or less in association with the parallel state and may be performed as much as 16 times or less in association with the anti-parallel state. For example, the read/write voltage (or current) may be variable between a first value corresponding to "1111" and a second value corresponding to "0000".

In some example embodiments, the operation of determining an optimal read/write voltage value through the table of FIG. 23 may be performed before the read and/or write operations of the memory device (e.g., during the idle time).

Figure 24:
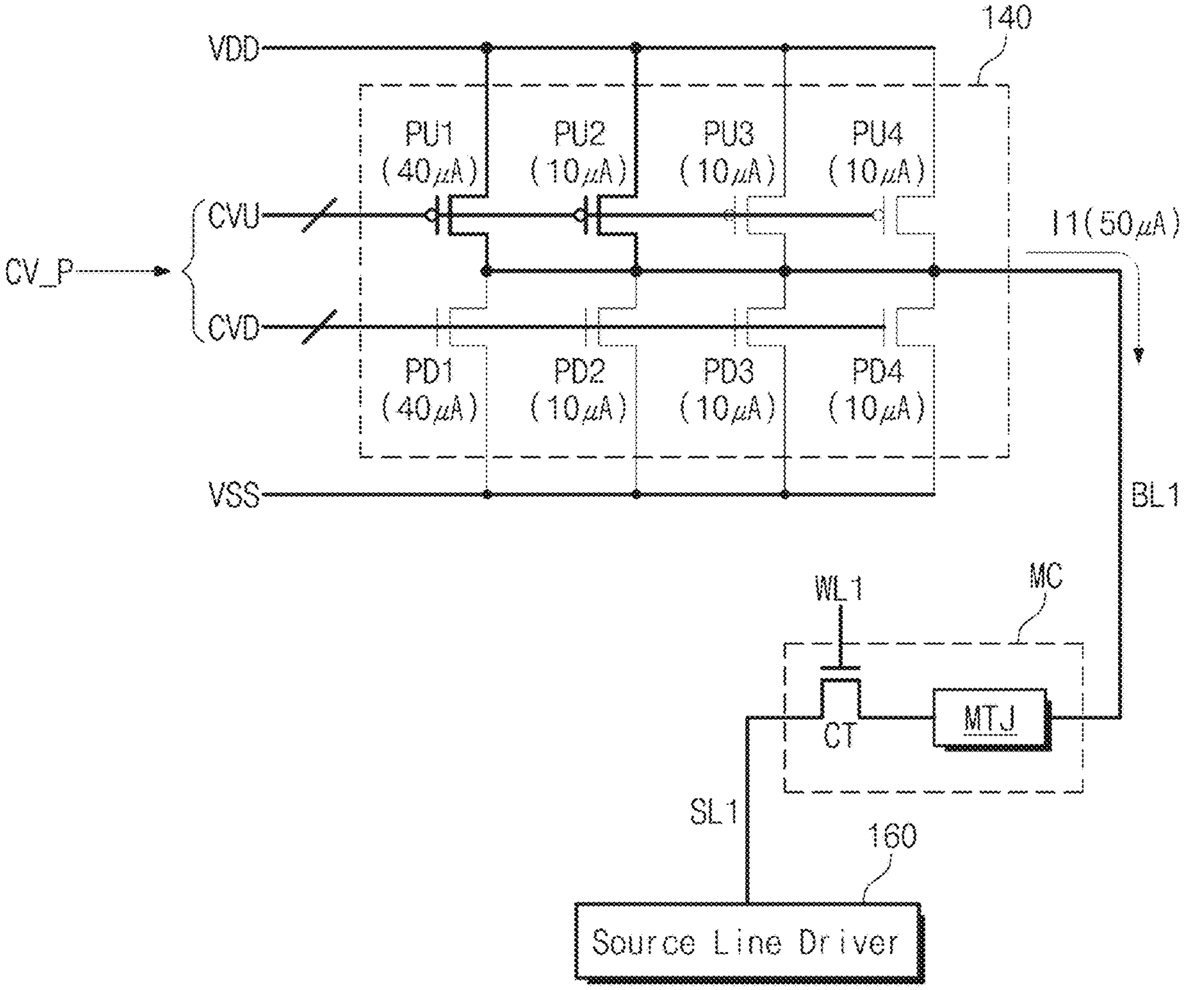
FIGS. 24 and 25 are circuit diagrams associated with a program operation of a write driver of FIG. 10.
Figure 25:
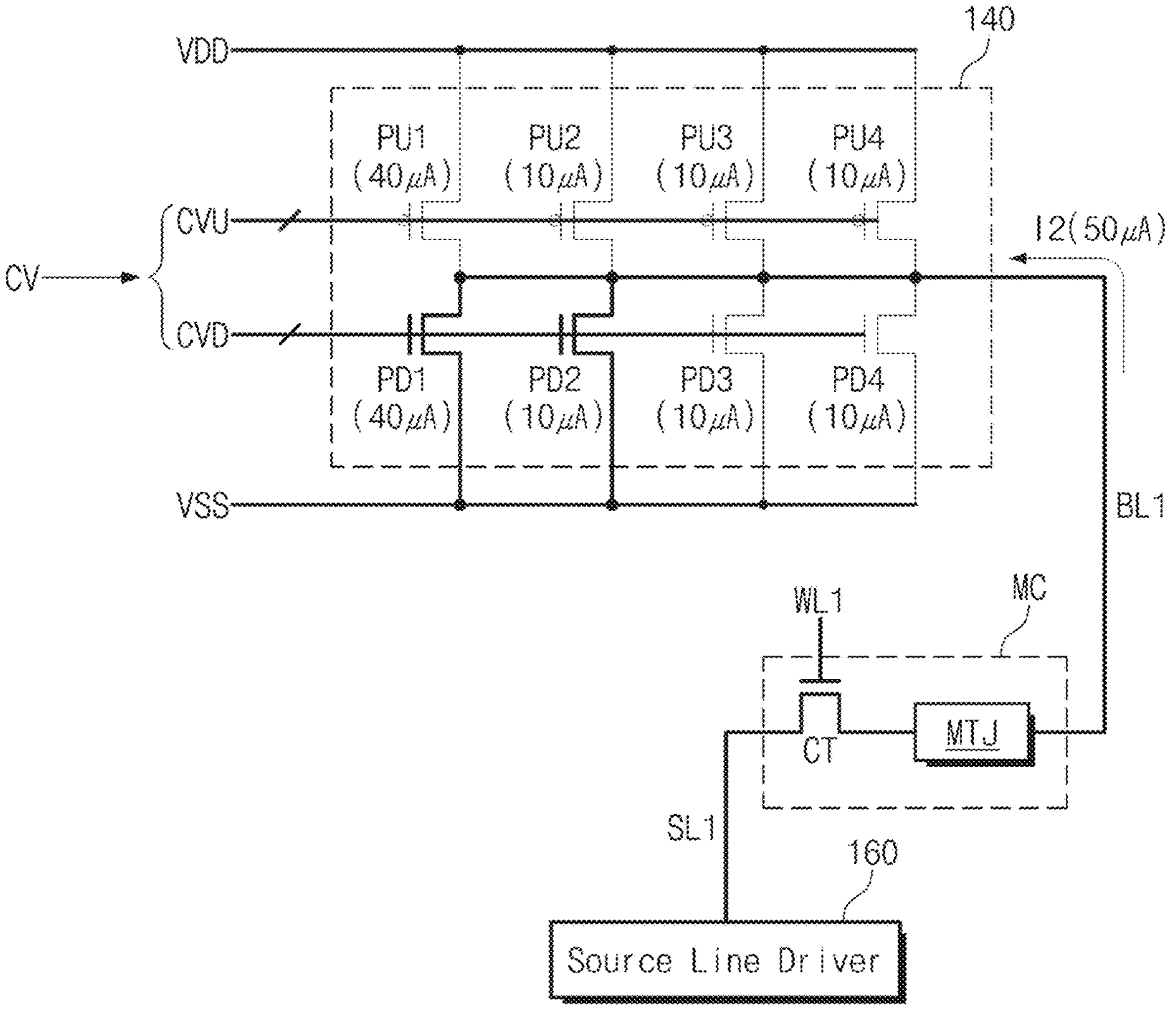

FIGS. 24 and 25 are circuit diagrams associated with a program operation of the write driver 140 of FIG. 10.

Referring to FIGS. 24 and 25, the write driver 140 may include transistors PU1 to PU4 and transistors PD1 to PD4. For example, each of the transistors PU1 and PD1 may have a channel width for driving a current of 40 μA, and each of the transistors PU2 to PU4 and PD2 to PD4 may have a channel width for driving a current of 10 μA.

In some example embodiments, FIG. 24 may be associated with the case where the write driver 140 pulls up a voltage of the first bit line BL1 to a first power supply voltage VDD. In the embodiment of FIG. 24, the write driver 140 may receive voltages corresponding to a first code value CVU of "0011" and voltages corresponding to a second code value CVD of "0000" from the voltage generator 182 (refer to FIG. 10).

Referring to FIG. 24, the transistors PD1 to PD4 may be turned off in response to the second code value CVD. The transistors PU1 and PU2 may be turned on in response to bits each having logic "0" from among bits of the first code value CVU, and the transistors PU3 and PU4 may be turned off in response to bits each having logic "1" from among the bits of the first code value CVU. Accordingly, the write current I1 of 50 μA may be driven through the turned-on transistors PU1 and PU2.

In some example embodiments, FIG. 25 may be associated with the case where the write driver 140 pulls down a voltage of the first bit line BL1 to a second power supply voltage VSS. In the embodiment of FIG. 25, the write driver 140 may receive the first code value CVU of "1111" and the second code value CVD of "1100" from the voltage generator 182 (refer to FIG. 10).

Referring to FIG. 25, the transistors PU1 to PU4 may be turned off in response to the first code value CVU. The transistors PD1 and PD2 may be turned on in response to bits each having logic "1" from among bits of the second code value CVD, and the transistors PD3 and PD4 may be turned off in response to bits each having logic "0" from among the bits of the second code value CVD. Accordingly, the write current I2 of 50 μA may be driven through the turned-on transistors PD1 and PD2.

In some example embodiments, the embodiment of FIG. 24 may be associated with the case of storing data of logic "0" in the memory cell MC, and the embodiment of FIG. 25 may be associated with the case of storing data of logic "1" in the memory cell MC. For example, to provide the code values CVU and CVD to the transistors PU1 to PU4 and PD1 to PD4 constituting the write driver 140, the voltage generator 182 (refer to FIG. 10) may include components such as a switch and a multiplexer.

Figure 26:
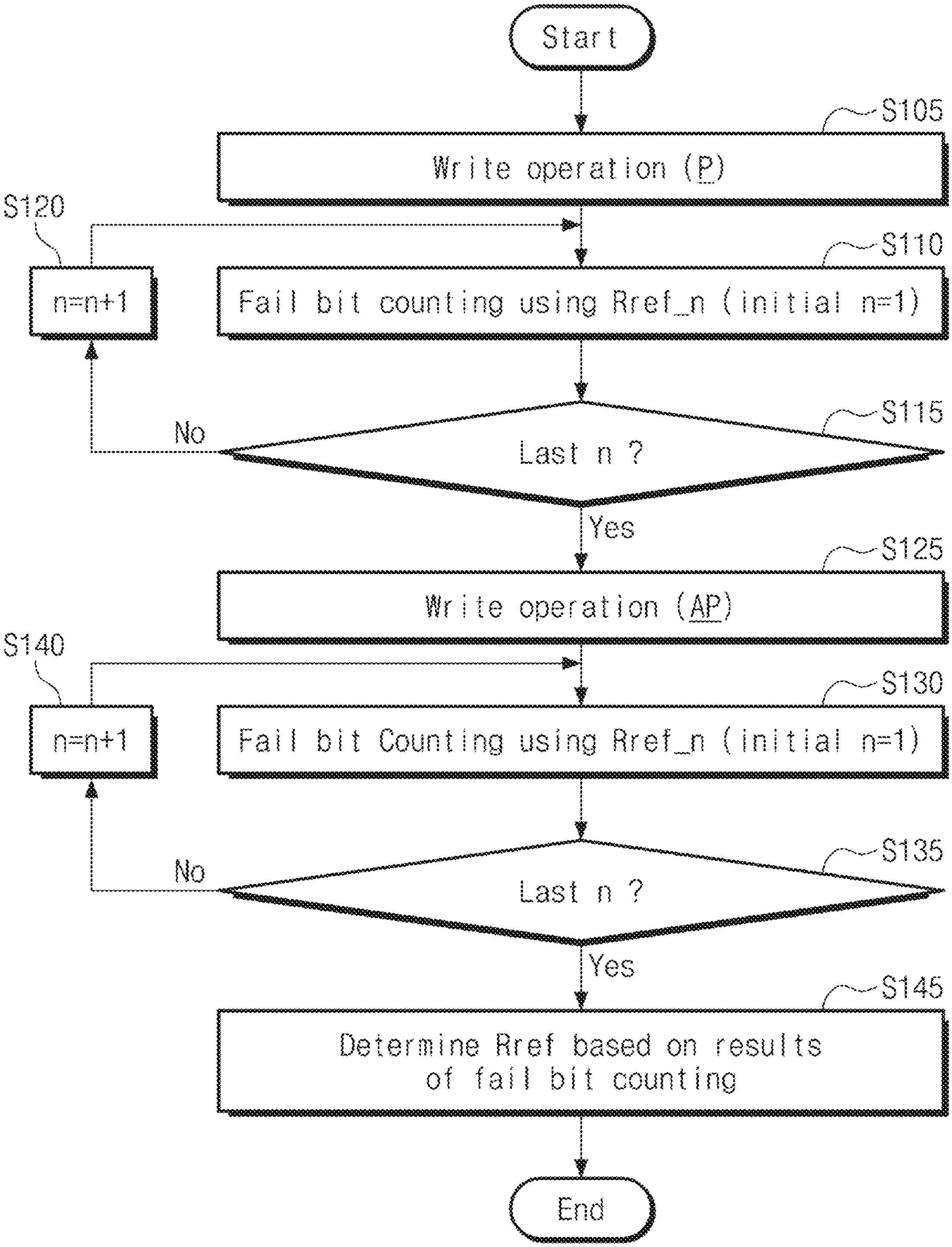
FIG. 26 is a flowchart illustrating a test method of a memory device according to various example embodiments.

FIG. 26 is a flowchart illustrating a test method of a memory device according to various example embodiments.

In operation S105, the pre-program operation on the memory device may be performed. For example, the test device may program memory cells constituting the memory device to have the resistance distribution Rp of the parallel state of FIG. 9.

In operation S110, fail bits of the memory device may be counted. In some example embodiments, the test device may count the number of fail bits of memory cells while varying a value of the reference resistor Rref. For example, the expression that an initial value of the reference resistance Rref is "1" may only mean an order of a reference resistance to be used in the test operation and may not be associated with a detailed reference resistance value. That is, a value of the reference resistance Rref which is first selected may not indicate the smallest reference resistance value among reference resistance values to be used to perform the test operation and may be any value selected by a memory vendor.

Afterwards, the test device may count the number of fail bits of memory cells while varying a value of the reference resistance Rref (i.e., may repeatedly perform operation S110, operation S115, and operation S120). As the fail bit counting operations using all the reference resistances provided for the test operation are completed, the fail bit counting operation associated with the parallel state may end.

In operation S125, the pre-program operation on a memory device may be performed. For example, the test device may program the memory cells constituting the memory device to have the resistance distribution Rap of the anti-parallel state of FIG. 9.

In operation S130, fail bits of the memory device may be counted. In some example embodiments, the test device may count the number of fail bits of memory cells while varying a value of the reference resistor Rref. As in the fail bit counting operation in the parallel state, a value of the reference resistance Rref which is selected in the fail bit counting operation may be arbitrarily selected regardless of an order of a resistance value among the provided resistance values.

The test device may count the number of fail bits generated in memory cells while varying the value of the reference resistance Rref (i.e., may repeatedly perform operation S130, operation S135, and operation S140); when the fail bit counting operation on the memory cells is completed in association with each reference resistance value provided for the test operation, the fail bit counting operation on the anti-parallel state may end.

In operation S145, a value of the reference resistance Rref may be determined based on results of the fail bit counting operations. For example, the test device may sum the number of fail bits in the parallel state counted for each reference resistance value and the number of fail bits in the anti-parallel state counted for each reference resistance value and may select a resistance value having the smallest summation result as the reference resistance value. The test operations described above may be operations performed at the high temperature HT, and the determined resistance value may be a reference resistance value at the high temperature HT.

Figure 27:
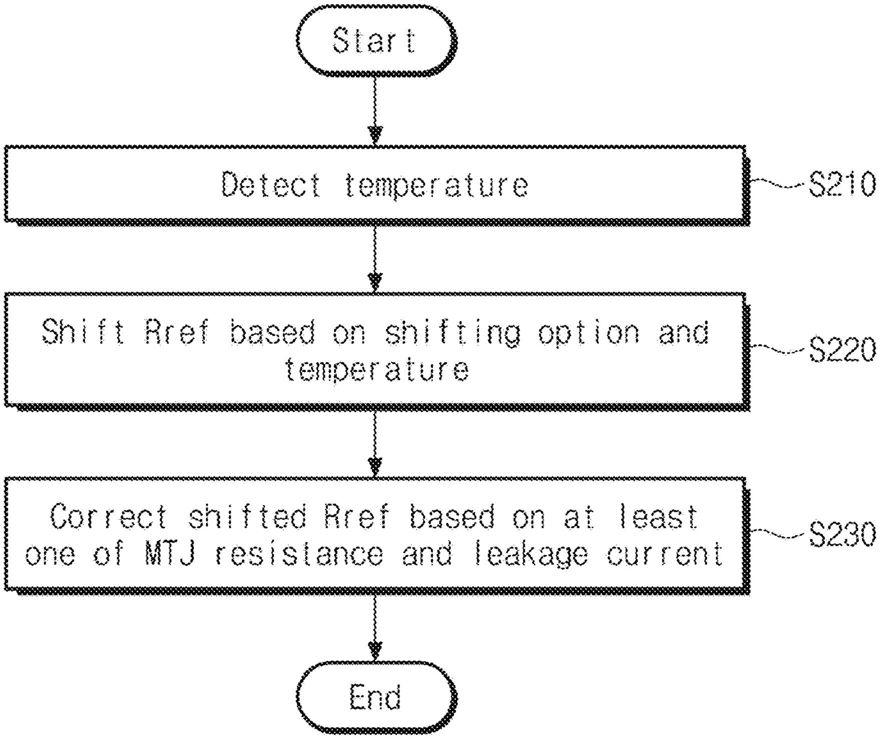
FIG. 27 is a flowchart illustrating an operation method of a memory device according to various example embodiments.

FIG. 27 is a flowchart illustrating an operation method of a memory device according to various example embodiments. For better understanding, FIG. 27 will be described together with reference to FIGS. 18 and 22.

In operation S210, a memory device may measure an ambient temperature. For example, the temperature sensor 154 may measure an ambient temperature and may provide information about the measured temperature to the mismatch correction circuit 156.

In operation S220, the memory device may shift a reference resistance value determined in the process of testing the memory device, based on the shifting option and the ambient temperature. For example, the shifting option may be one shifting option, which is selected in the process of testing the memory device, from among the plurality of shifting options. The shifting option may be stored and loaded inside or outside the mismatch correction circuit 156.

In operation S230, the memory device may correct the shifted reference resistance value, based on at least one of an MTJ resistance and a leakage current. For example, a value of the MTJ resistance may be determined based on a resistance distribution diagram of a memory chip and may be associated with the size of the memory cell. The leakage current may mean a leakage current flowing to a memory cell, which is not targeted for the program or read operation, from among memory cells connected to the same bit line.

In some example embodiments, a shifting option, a correction value corresponding to a value of an MTJ resistance at the specific temperature, and a correction value corresponding to a value of a leakage current at the specific temperature may be determined in advance in the process of testing the memory device and may be stored in the memory device. The shifting option and the correction values may be loaded and used when the memory device operates.

Figure 28:
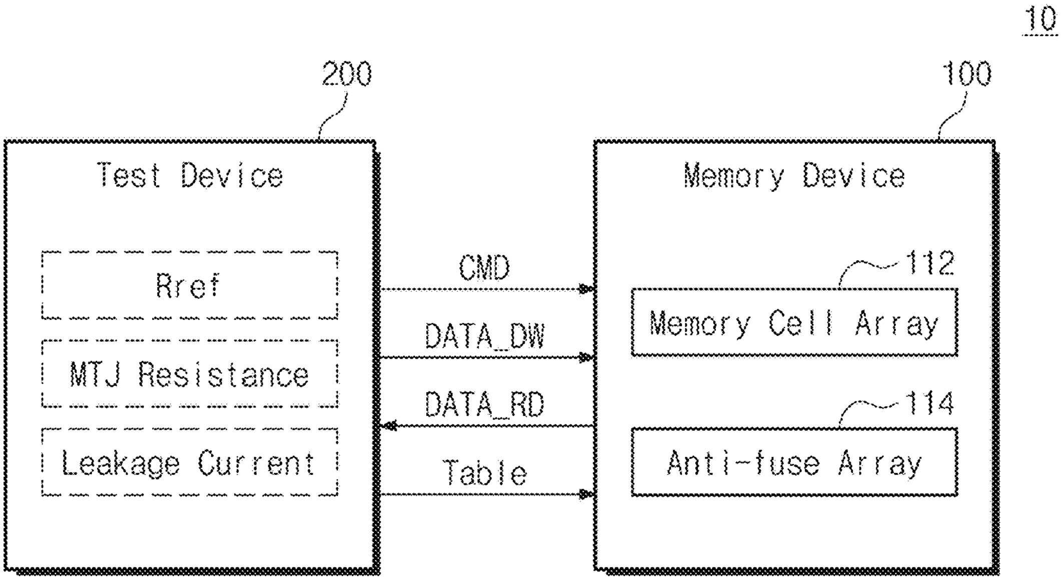
FIG. 28 is a block diagram associated with testing a memory device, according to various example embodiments.

FIG. 28 is a block diagram associated with testing a memory device, according to various example embodiments.

The memory device 100 includes a memory cell array. The memory device 100 may be an implementation example of the memory device 100 described with through to FIGS. 1 to 27. The memory cell array may include a first region 112 and a second region 114. The first region 112 which is a user region may refer to a region where data intended by the user are stored. The second region 114 which is or includes a vendor region may be a region in which data intended by the memory vendor are stored. For example, the second region 114 may include an anti-fuse array. For example, the second region 114 may store the reference resistance value at the high temperature HT described with reference to FIGS. 1 to 27 and may store the correction values corresponding to the MTJ resistance value and the leakage current value.

A test device 200 may perform various test operations on the memory device 100. To this end, the test device 200 may send a command CMD to the memory device 100.

In some example embodiments, the command CMD may include a command for programming the first region 112 of the memory cell array to a specific program state (e.g., the parallel state or the anti-parallel state). The test device 200 may transmit dummy write data DATA_DW for programming the first region 112 to the parallel state or the anti-parallel state, together with transmitting the command CMD.

In some example embodiments, the command CMD may be used to perform the read operation for counting the number of fail bits for each reference resistance value in association with the specific program state (i.e., the parallel state or the anti-parallel state). Read data DATA_RD may be received from the memory device 100 as a read result.

In some example embodiments, the test device 200 may count the number of fail bits for each reference resistance value based on the read data DATA_RD received from the memory device 100, may determine an optimal value of the reference resistor Rref based on counting results, and may determine an optimal value of the read voltage (or current) based on the optimal value of the reference resistor Rref.

As described above, when the memory device of the present disclosure shifts a reference resistance value used in the read operation and/or the write operation, the memory device performs the shifting operation in consideration of an ambient temperature. In addition, as the memory device of the present disclosure corrects the reference resistance value shifted in consideration of a resistance of a memory cell (i.e., an MTJ resistance) and/or a leakage current together, the memory device obtains a reference resistance value at any other temperature in addition to a reference temperature (e.g., a high temperature). According to the above description, because there is no need to test optimal reference resistance values in all the temperature zones, a test time may be shortened. In addition, because the error caused by the skew difference is capable of being corrected, the reliability of the memory chip may be improved.

Figure 29:
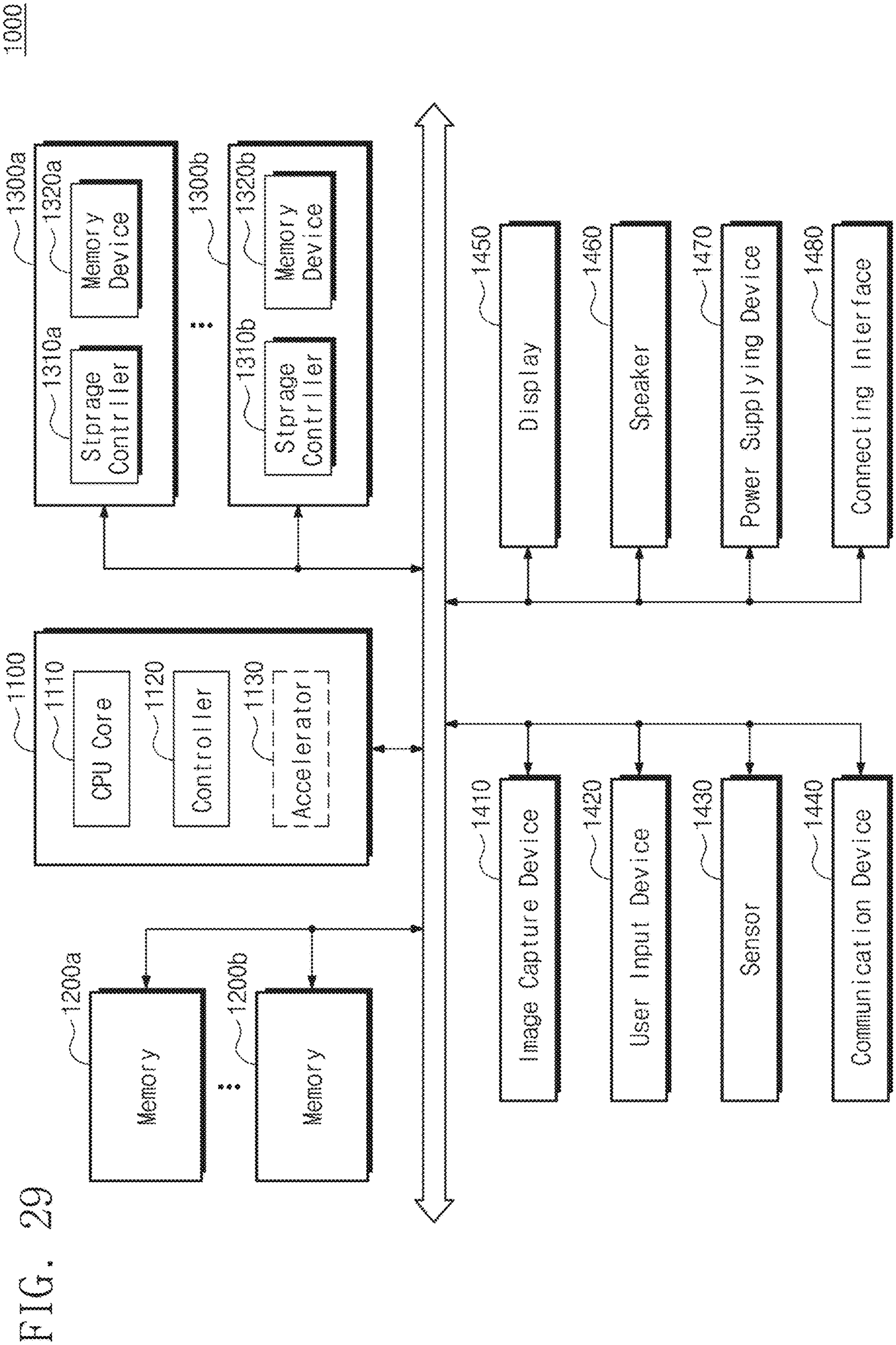
FIG. 29 is a diagram illustrating a system to which a memory device according to various example embodiments is applied.

FIG. 29 is a diagram of a system 1000 to which a memory device is applied, according to some example embodiments.

The system 1000 may basically be a mobile system, such as a portable communication terminal (e.g., a mobile phone), a smartphone, a tablet personal computer (PC), a wearable device, a healthcare device, or an Internet of things (IoT) device. However, the system 1000 is not necessarily limited to the mobile system and may be a PC, a laptop computer, a server, a media player, or an automotive device (e.g., a navigation device).

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200*a* and 1200*b* and/or the storage devices 1300*a* and 1300*b*. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200*a* and 1200*b* may be used as main memory devices of the system 1000. Although each of the memories 1200*a* and 1200*b* may include a volatile memory, such as static random access memory (SRAM) and/or dynamic RAM (DRAM), each of the memories 1200*a* and 1200*b* may include non-volatile memory, such as a flash memory, phase-change RAM (PRAM) and/or resistive RAM (RRAM). The memories 1200*a* and 1200*b* may be implemented in the same package as the main processor 1100.

The storage devices 1300*a* and 1300*b* may serve as non-volatile storage devices configured to store data regardless of whether power is supplied thereto, and have larger storage capacity than the memories 1200*a* and 1200*b*. The storage devices 1300*a* and 1300*b* may respectively include storage controllers (STRG CTRL) 1310*a* and 1310*b* and NVM (Non-Volatile Memory) 1320*a* and 1320*b* configured to store data via the control of the storage controllers 1310*a* and 1310*b*. Although the NVMs 1320*a* and 1320*b* may include flash memories having a two-dimensional (2D) structure and/or a three-dimensional (3D) V-NAND structure, the NVMs 1320*a* and 1320*b* may include other types of NVMs, such as PRAM and/or RRAM.

The storage devices 1300*a* and 1300*b* may be physically separated from the main processor 1100 and included in the system 1000 or implemented in the same package as the main processor 1100. In addition, the storage devices 1300*a* and 1300*b* may have types of solid-state devices (SSDs) and/or memory cards and be removably combined with other components of the system 100 through an interface, such as the connecting interface 1480 that will be described below. The storage devices 1300*a* and 1300*b* may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include one or more of a camera, a camcorder, or a webcam.

The user input device 1420 may receive various types of data input by a user of the system 1000 and include one or more of a touch pad, a keypad, a keyboard, a mouse, or a microphone.

The sensor 1430 may detect various types of physical quantities, which may be obtained from the outside of the system 1000, and convert the detected physical quantities into electric signals. The sensor 1430 may include one or more of a temperature sensor, a pressure sensor, an illuminance sensor, a position sensor, an acceleration sensor, a biosensor, or a gyroscope sensor.

The communication device 1440 may transmit and receive signals between other devices outside the system 1000 according to various communication protocols. The communication device 1440 may include one or more of an antenna, a transceiver, or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as one or more of advanced technology attachment (ATA), serial ATA (SATA), external SATA (e-SATA), small computer system interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

According to various example embodiments, a good or an optimal reference resistance value may be determined through a reduced or the minimum number of times, and/or a good or an optimal reference resistance value may be determined in consideration of an ambient temperature and a physical characteristic of an MTJ element.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been described with reference to embodiments thereof, it will be apparent to those of ordinary skill in the art that various changes and modifications may be made thereto without departing from the spirit and scope of the present disclosure as set forth in the following claims. Additionally example embodiments are not necessarily mutually exclusive with one another. For example, some example embodiments may include one or more features described with reference to one or more figures, and may also include one or more other features described with reference to one or more other figures.

What is claimed is:

1. A memory device comprising:

a memory cell array including a plurality of memory cells, the memory cell array divided into a first region having first memory cells of the plurality of memory cells and a second region having second memory cells of the plurality of memory cells, wherein the first memory cells of the first region are configured to store data, and the second memory cells of the second region are configured to store a value of a reference resistance for distinguishing a parallel state and an anti-parallel state of the first memory cells where the data are stored;

a sensing circuit configured to determine the data stored in the first memory cells of the first region based on the reference resistance; and a mismatch correction circuit configured to:

depending on a temperature, shift the value of the reference resistance stored in the second memory cells of the second region, and adjust the shifted value of the reference resistance based on at least one of a value of a magnetic tunnel junction (MTJ) resistance of the memory cell array and a leakage current of the memory cell array.

2. The memory device of claim 1, wherein the value of the MTJ resistance of the memory cell array is obtained based on a resistance distribution diagram of the memory cell array programmed at a reference temperature.

3. The memory device of claim 1, wherein the leakage current is based on a leakage current flowing to a memory cell, which is not targeted for a read operation or a program operation, from among memory cells connected to one bit line.

4. The memory device of claim 1, further comprising:

a leakage current detector configured to detect the leakage current.

5. The memory device of claim 1, wherein the sensing circuit includes:

a first current source configured to generate a first read current;

a second current source configured to generate a second read current; and a sense amplifier configured to amplify a difference between a first voltage drop at a first node and a second voltage drop at a second node, the first voltage drop in response to the first read current being applied to a first bit line connected to a selected memory cell, the second voltage drop at a second node in response to the second read current being applied to a reference bit line.

6. The memory device of claim 1, further comprising:

a voltage generator configured to generate a code value; and a write driver configured to perform a program operation on the first region based on the code value, and wherein the write driver includes, first-type transistors each including a first end connected to a first power supply voltage and a second end connected to an output node, and second-type transistors each including a first end connected to a second power supply voltage and a second end connected to the output node.

7. The memory device of claim 1, wherein each of the plurality of memory cells includes:

a cell transistor including a first end connected to a source line, and a gate electrode connected to a word line; and a magnetic tunneling junction element including a first end connected to a second end of the cell transistor and a second end connected to a bit line.

8. The memory device of claim 1, wherein the second region has anti-fuse cell array.

* * * * *